(12) United States Patent
Shimizu et al.

(10) Patent No.: US 6,934,311 B2
(45) Date of Patent: Aug. 23, 2005

(54) SEMICONDUCTOR LASER MODULE AND RAMAN AMPLIFIER

(75) Inventors: Hiroshi Shimizu, Tokyo (JP); Naoki Tsukiji, Tokyo (JP); Junji Yoshida, Tokyo (JP); Toshio Kimura, Tokyo (JP); Yutaka Ohki, Tokyo (JP); Kouhei Terada, Tokyo (JP); Hidehiro Taniguchi, Tokyo (JP)

(73) Assignee: The Furukawa Manufacturing Co., Ltd., Tokyo (JP)

( * ) Notice: Subject to any disclaimer, the term of this patent is extended or adjusted under 35 U.S.C. 154(b) by 75 days.

(21) Appl. No.: 10/329,716

(22) Filed: Dec. 27, 2002

(65) Prior Publication Data

US 2003/0128728 A1 Jul. 10, 2003

(30) Foreign Application Priority Data

Dec. 27, 2001 (JP) ................................... 2001-398154
Jan. 15, 2002 (JP) ................................... 2002-005991
Aug. 9, 2002 (JP) ................................... 2002-233967

(51) Int. Cl.[7] .............................. H01S 3/30; H01S 5/00; H01S 3/098; H01S 3/08
(52) U.S. Cl. ........................... 372/43; 372/3; 372/19; 372/98; 372/102; 372/105

(58) Field of Search ............................. 372/18, 19, 43, 372/50, 98, 102, 105, 107, 6, 49, 96, 99, 101, 3

(56) References Cited

U.S. PATENT DOCUMENTS

| | | | | |
|---|---|---|---|---|
| 5,353,294 A | * | 10/1994 | Shigeno | 372/43 |
| 6,343,088 B1 | * | 1/2002 | Mugino et al. | 372/49 |
| 6,384,963 B2 | | 5/2002 | Ackerman et al. | |
| 6,488,419 B2 | * | 12/2002 | Kato et al. | 385/93 |
| 6,563,983 B2 | * | 5/2003 | Hatta et al. | 385/33 |
| 6,631,238 B2 | * | 10/2003 | Liu et al. | 385/140 |

FOREIGN PATENT DOCUMENTS

JP      10-78531      3/1998

* cited by examiner

*Primary Examiner*—Minsun Oh Harvey
*Assistant Examiner*—Armando Rodriquez
(74) *Attorney, Agent, or Firm*—Oblon, Spivak, McClelland, Maier & Neustadt, P.C.

(57) ABSTRACT

A semiconductor laser module has a Fabry-Perot type semiconductor laser device, an optical fiber, and first and second lenses. The tip of the optical fiber, on which the laser beam falls, is askew polished. The optical fiber is fixed in such a manner that the axis of the optical fiber makes an angle with respect to an optical axis of the laser beam. Coatings that avoid reflection are formed on the tip of the optical fiber, and on the first and second lenses.

21 Claims, 21 Drawing Sheets

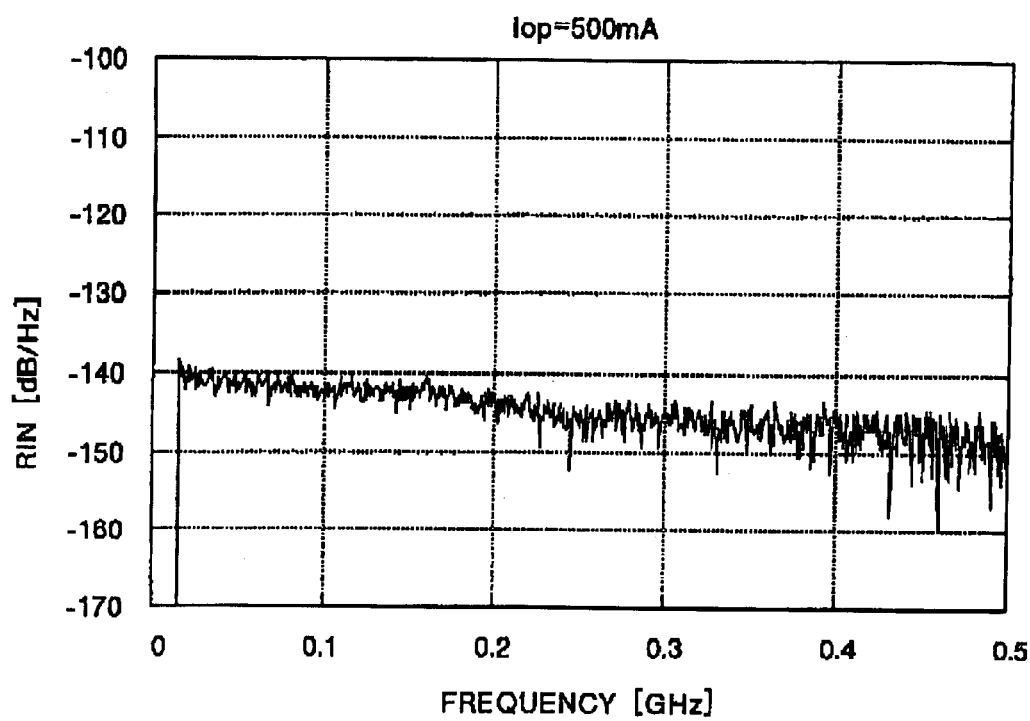
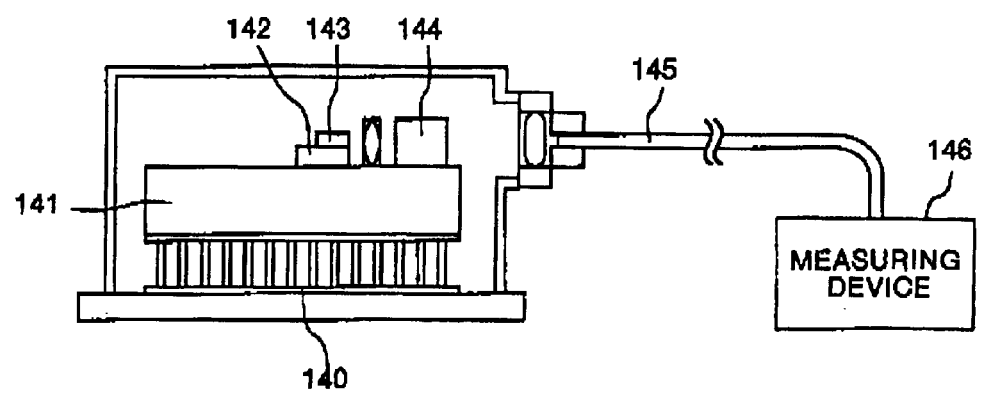

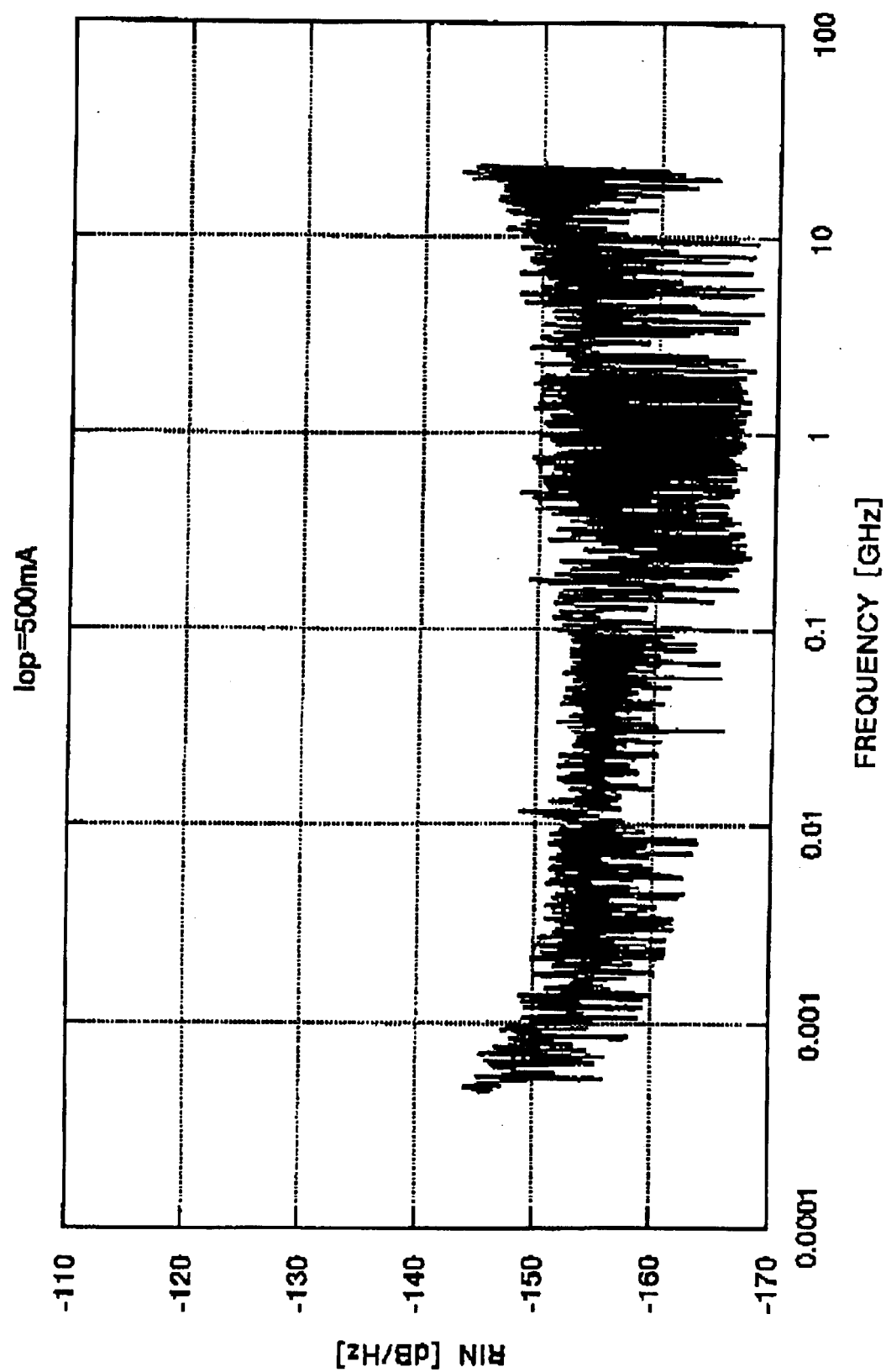
FIG.5 Iop=500mA

20 SEMICONDUCTOR LASER ELEMENT
- 10 p-SIDE ELECTRODE
- 7 InGaAsP CAP LAYER
- 6 p-InP CLAD LAYER
- 9 n-InP BLOCKING LAYER
- 8 p-InP BLOCKING LAYER
- 2 n-InP BUFFER LAYER
- 1 n-InP SUBSTRATE
- 11 n-SIDE ELECTRODE
- 3 GRIN-SCH-MQW ACTIVE LAYER
- 2 n-InP BUFFER LAYER
- 13 DIFFRACTION GRATING
- 4 p-InP SPACER LAYER

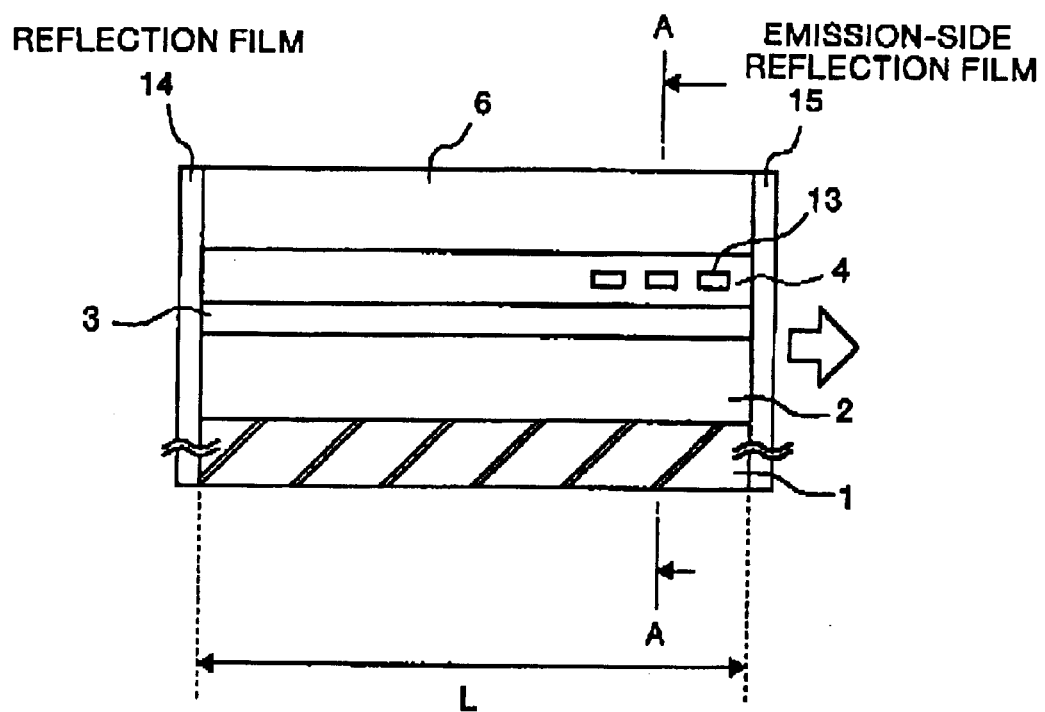
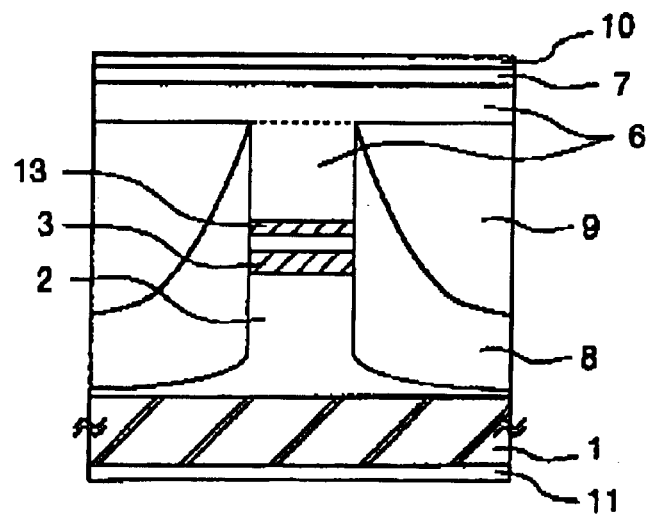

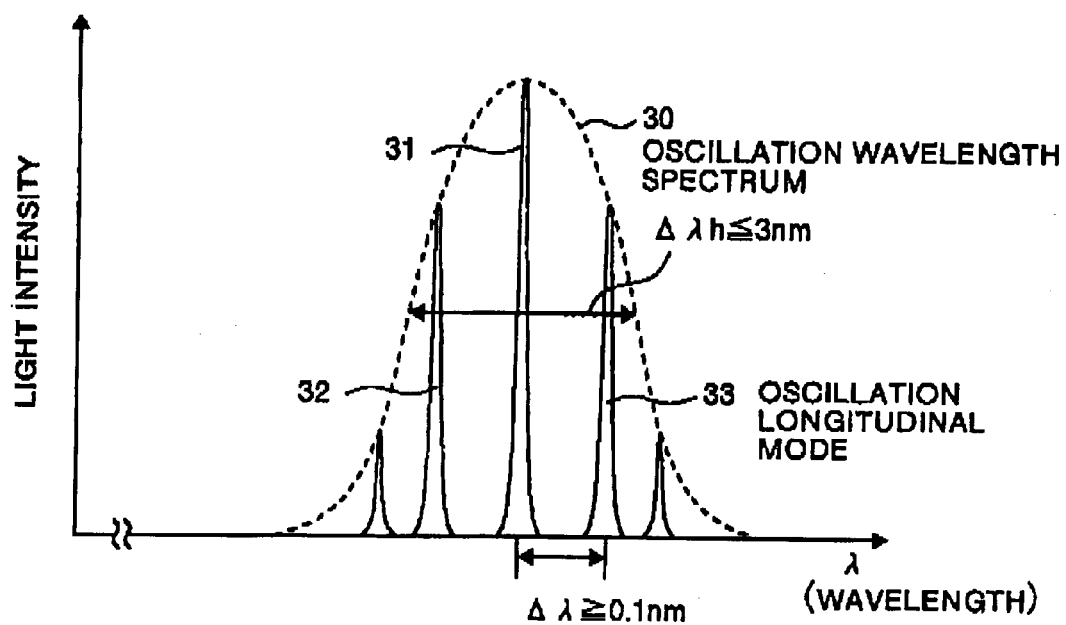

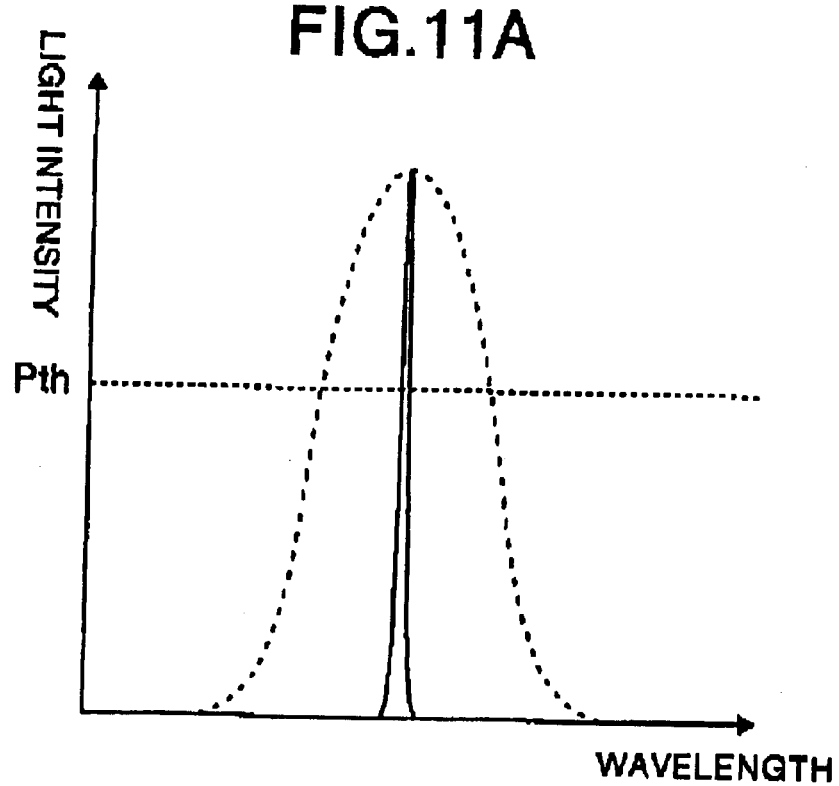
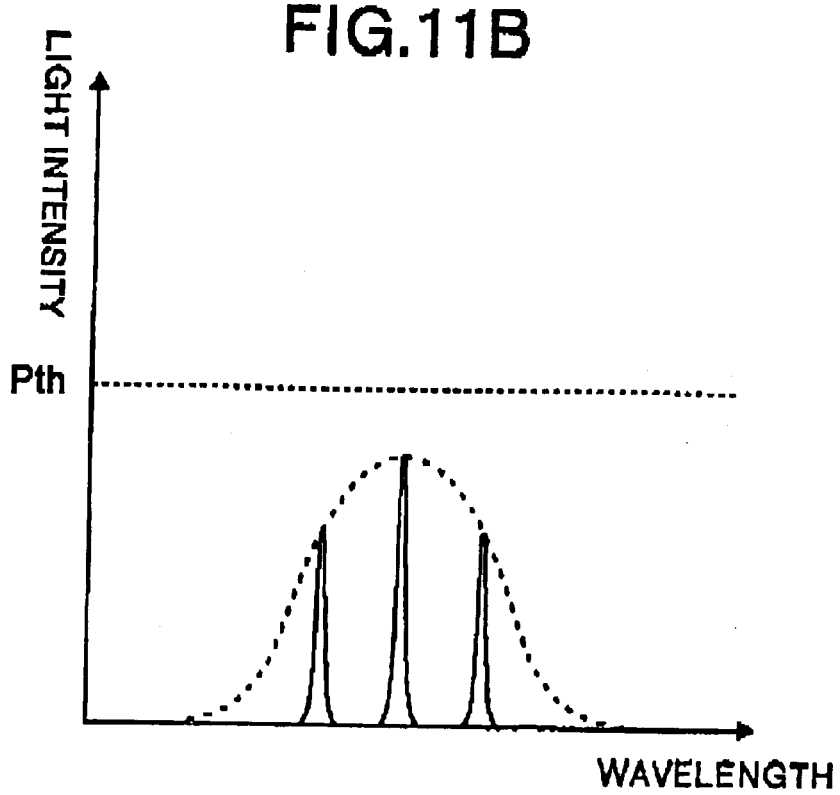

SEMICONDUCTOR LASER MODULE AND RAMAN AMPLIFIER

BACKGROUND OF THE INVENTION

1) Field of the Invention

The present invention relates to a semiconductor laser module and a Raman amplifier that has reduced relative intensity noise (RIN).

2) Description of the Related Art

Following the recent rapid spread of the Internet and the rapid increase of in-company LAN connection, an increase in data traffic appears as a problem. A dense-wavelength division multiplexing (DWDM) transmission system which has been developed to prevent a decrease in communication performance due to increased data traffic is spreading fast.

The DWDM transmission system realizes a large capacity transmission that transfers 100 times larger signal than the conventional system by carrying multiple optical signals on different wavelengths on a single fiber. The existing DWDM transmission system particularly enables wideband, long-distance transmission using an erbium-doped fiber amplifier (EDFA). The EDFA, Er-doped optical fiber, amplifies signals with the wavelength of 1550 nm when transmits the laser with the wavelength of 1480 nm or 980 nm.

On the other hand, The EDFA is a centralization type optical amplifier which centralized the excitation of an optical signal. The EDFA has, therefore, restrictions which include noise accumulation due to the loss of a transmission optical fiber, and signal distortion and noise generation due to the non-linearity of a transmission optical fiber. In addition, since the EDFA enables amplifying light in a wavelength band only set by the Er band gap energy, it is difficult to widen band to realize further multiplexing.

In these circumstances, attention is paid to a Raman amplifier as an optical fiber amplifier to replace the EDFA. The Raman amplifier is a distribution type optical amplifier which does not require a special fiber such as the erbium-doped fiber as required by the EDFA but employs an ordinary transmission fiber as a gain medium. Therefore, the Raman amplifier realizes uniform gain in a wider transmission band than that of the conventional EDFA-based DWDM transmission system.

FIG. 18 is a block diagram which shows the configuration of a conventional Raman amplifier employed by the DWDM transmission system. Each of semiconductor laser modules, 183a to 183d, includes a Fabry-Perot type semiconductor laser device. Each of semiconductor laser modules 183a to 183d emits a laser beam, from which an excitation light is generated, to respective polarization synthesis couplers 61a and 61b. The laser beams emitted by the semiconductor laser modules 183a and 183b have same wavelength, however, the polarization synthesis coupler 61a makes their polarization surfaces different from each other by 90°. Likewise, the laser beams emitted by the semiconductor laser modules 183c and 183d have same wavelength, however, the polarization synthesis coupler 61b makes their polarization surfaces different from each other by 90°. The polarization synthesis couplers 61a and 61b transmit the polarization synthesized laser beams to a WDM coupler 62, respectively. It is noted that the laser beams emitted from the polarization synthetic couplers 61a and 61b had different wavelengths.

The WDM coupler 62 synthesizes the laser beams from the polarization synthesis couplers 61a and 61b. A laser beam from the WDM coupler 62 passes through an isolator 60 and a WDM coupler 65, and then is incident on an amplification fiber 64 as an excitation light. While the amplification fiber 64 amplifies target optical signal which is input from a signal light input fiber 69 through an isolator 63 to pass, the amplification fiber 64 combines the signal light with the excitation light and Raman-amplifies the combined signal.

Raman-amplified optical signal in the amplification fiber 64 is transmitted into a monitor light distribution coupler 67 trough the WDM coupler 65 and an isolator 66. The monitor light distribution coupler 67 emits a part of the amplified optical signal to a control circuit 68 and the remainings to an optical signal output fiber 70 as output light The control circuit 68 controls the light emitting states, e.g., light intensities, of semiconductor laser devices 180a to 180d based on the partially input the amplified optical signal into itself, and the control circuit 68 controls feedback whether the gain band of the Raman amplification is flat.

FIG. 19 is a longitudinal sectional view which shows the configuration of the semiconductor laser module employed in the conventional Raman amplifier. In FIG. 19, a semiconductor laser module 183 includes a Peltier module 200 which is arranged on the inner bottom of a package 202 formed out of Cu—W alloy or the like. A base 197 is placed on the Peltier module 200, a carrier 198 is on the base 197, and a sub-mount 199 is on the carrier 198. Further, a semiconductor laser device 180 is positioned on this sub-mount 199.

Electric current is applied to the Peltier module 200 to thereby heat or cool the semiconductor laser device 180 according to the polarity of the applied current. However, the Peltier module 200 is generally used as a cooler to prevent an oscillation wavelength variance caused by the temperature increase of the semiconductor laser device 180. In other word, if a laser beam has a longer wavelength than a desired wavelength, the Peltier module 200 heats up the semiconductor laser device 180. Or, if a laser beam has a shorter wavelength than the desired wavelength, the Peltier module 200 cools down the semiconductor laser device 180. Specifically, this temperature control is based on a value detected by a thermistor (the figure is omitted), which is located on the sub-mount 199 and near the semiconductor laser device 180. A controller (also the figure is omitted) controls the Peltier module 200 so as to keep the temperature of the semiconductor laser device 180 constant.

On the base 197, not only the carrier 198 but also a first lens 192, an isolator 193 and a monitor photodiode 196 are placed. The laser beam emitted from the semiconductor laser device 180 is converged by a second lens 194 through the first lens 192 and the isolator 193. The laser beam converged by the second lens 194 is introduced into an optical fiber 203 which is fixed by a ferrule 201. The monitor photodiode 196 monitors and detects light leaked from the reflection coating of the semiconductor laser device 180.

Another example of the conventional Raman amplifier is explained. FIG. 20 is a block diagram which shows the configuration of another example of the conventional Raman amplifier which is employed in the DWDM transmission system. In FIG. 20, the same constituent devices as those in FIG. 18 are denoted by the same reference numerals and are not be described herein. The Raman amplifier shown in FIG. 20 differs from the Raman amplifier shown in FIG. 18 only in that the semiconductor laser modules 183a to 183d are replaced by semiconductor laser modules 182a to 182d, respectively. The semiconductor laser module 182a consists of a Fabry-Perot type semiconductor laser device 180a and a fiber grating 181a. Likewise, the other semiconductor laser modules 182b to 182d consist of Fabry-Perot type semiconductor laser devices 180b to 180d and fiber gratings 181b to 181d, respectively.

FIG. 21 is a longitudinal sectional view which shows the configuration of the semiconductor laser module employed in the other example of the conventional Raman amplifier described above. In FIG. 21, the same constituent devices as those in FIG. 19 are denoted by the same reference numerals, and are not described herein. The semiconductor laser module shown in FIG. 21 includes a fiber grating 181 at a predetermined position of an optical fiber 203. What differs from the semiconductor laser module in FIG. 19 is that a laser beam converged by a second lens 194 is introduced into the optical fiber 203 fixed by a ferrule 201 and then introduced to the fiber grating 181.

FIG. 22 is an explanatory view which explains the structure of the semiconductor laser device and the function of the fiber grating in the semiconductor laser module shown in FIG. 21. In FIG. 22, the semiconductor laser device 180 has an active layer 221. The active layer 221 has an optical reflection surface 222 on one end and an optical emission surface 223 on the other end. The light generated in the active layer 221 is reflected by the optical reflection surface 222 and emitted from the optical emission surface 223.

As shown in FIG. 21, the optical fiber 203 is arranged to face the optical emission surface 223 of the semiconductor laser device 180. The optical fiber 203 is optically coupled with the optical emission surface 223 of the semiconductor laser device 180. The fiber grating 181 located at a predetermined position relative to the optical emission surface 223 is formed in a core 232 in the optical fiber 203. The fiber grating 181 selectively reflects the laser beam with a specific wavelength. Namely, the fiber grating 181 functions as an external resonator, and a resonator is formed between the fiber grating 181 and the optical reflection surface 222. The laser beam that is selected by the fiber grating 181 is amplified and emitted as an output laser beam 241.

However, in each of the semiconductor laser module 183 shown in FIG. 19 and the semiconductor laser module 182 shown in FIG. 21, the laser beam emitted from the semiconductor laser device 180 may possibly be reflected by the incident surface of the first lens 192, by the incident surface of the isolator 193 by and the incident surface of the second lens 194. The reflected beam is incident on the semiconductor laser device 180 as return beam, which causes an increase of RIN. Further, as shown in FIGS. 19 and 21, since the incident end surface of the optical fiber 203 is perpendicular to the optical axis of the incident laser beam, the reflected beam on the end surface is also a factor for RIN increase.

Amplification occurs fast particularly in Raman amplification. Therefore, if the intensity of excitation light fluctuates, Raman gain also fluctuates. This Raman gain fluctuation results in fluctuation in the intensity of an amplified signal, which disadvantageously hampers Raman amplification.

In the semiconductor laser module 182 shown in FIG. 21, since the distance between the fiber grating 181 and the semiconductor laser device 180 is large, the RIN is increased by the resonance between the fiber grating 181 and the optical reflection surface 222. This is because, in an RIN spectrum, peaks occur at the every frequency which corresponds to the reciprocal of the time what takes for the beam to round-trip between the optical reflection surface 222 of the semiconductor laser device 180 and the fiber grating 181.

Because of the fast amplification in Raman amplification, if the intensity of the excitation light fluctuates, Raman gain also fluctuates. This Raman gain fluctuation results in the fluctuation of the amplified signal intensity, which disadvantageously hampers stable Raman amplification.

In the semiconductor laser module 182 shown in FIG. 21, it is necessary to optically couple the optical fiber 203 which includes the fiber grating 181 with the semiconductor laser device 180. To do so, it takes time and labor for optical axis alignment during assembly. In addition, since this optical coupling is mechanical optical coupling in the resonator, the oscillation characteristic of the laser may possibly change according to mechanical vibration, which may disadvantageously make it impossible to provide stable excitation beam.

FIG. 23 shows the RIN characteristic of the semiconductor laser module shown in FIG. 21. FIG. 24 shows a measurement system with which the RIN characteristic shown in FIG. 23 is obtained. As shown in FIG. 24, a semiconductor laser module 300 is driven by a laser module driver 302. Laser beam emitted from the module 300 is attenuated by an optical attenuator 303 and falls on an optical signal analyzer 304. This optical signal analyzer 304 measures the RIN. Products HP70810B and HP70908A (Hewlett-Packard Co.) are particularly used here as the optical signal analyzers 304. The optical signal analyzers 304 adjust the optical attenuator 303 so as to be able to input light of 2.5 dBm while an internal attenuator of each analyzer set at 0 dB. More detailed measurement conditions are as follow. The resolution band width is automatically set in a measurement range of 0 to 22 GHz, set at 0.3 MHz in a measurement range of 0 to 2 GHz, set at 0.3 MHz in a measurement range of 0 to 0.1 GHz, and sets at 0.464 MHz in a measurement range of 0 to 0.01 GHz. As shown in FIG. 23, the result of the RIN measurement under the measurement conditions shows that the RIN characteristic is deteriorated with a driving current $I_{op}$ is equal to 900 mA.

Meanwhile, there are a forward excitation type Raman amplifier which excites optical signal forward and a bidirectional excitation type Raman amplifier which excites signal light from two directions as well as the forward excitation type Raman amplifier, shown in FIGS. 18 and 20, which amplifies optical signal backward. Recently, the backward excitation type Raman amplifier is used more frequently than the other types. The reason is as follows. The forward excitation type Raman amplifier in which weak optical signal travels in the same direction along with the strong excitation light has disadvantages that a fluctuation in the intensity of the excitation light tends to move to the optical signal, such a nonlinear effect as four-optical-wave mixture tends to occur, and the polarization dependency of the excitation light tends to appear. Therefore, the intensity of an excitation optical source (which consists of the semiconductor laser module, the polarization synthetic coupler and the WDM coupler) which is employed in the forward excitation type Raman amplifier cannot increase. Compared to the intensity of the excitation optical source which is employed in the backward excitation type Raman amplifier, the forward excitation type Raman amplifier is required to be actuated at a low excitation light intensity. However, if the driving current of the semiconductor laser device 180 goes down too low in order to reduce the excitation optical intensity, it appears that the influence of relaxation oscillation on the low frequency range of the RIN, therefore the RIN increases. As a result, it is desired to stabilize an excitation optical source in the forward excitation type Raman Amplifier. Further, the Raman amplifier shown in FIG. 20 has a disadvantage in that the presence of the fiber grating limits applicable excitation types.

Raman amplification is under the condition that the direction of the polarized optical wave is on the same direction of the excitation light. That is, since the gain of the Raman amplification has polarization dependency, it is necessary to decrease the effect of a variance between the directions of polarized optical wave and the excitation light. In the backward excitation type Raman amplifier, the polarization of the optical wave is at random during propagation, so it causes no problem.

However, in the forward excitation type Raman amplifier, the gain has a high polarization dependency which, therefore, needs to be reduced by orthogonal synthesis, depolarization or the like of the excitation light. In other words, it is necessary to decrease degree of polarization (DOP).

SUMMARY OF THE INVENTION

The objective of this invention is to provide a semiconductor laser module suitable for the light source of a forward excitation type Raman amplifier that can suppress the deterioration of RIN characteristic, and a Raman amplifier which utilizes this semiconductor laser module.

The semiconductor laser module according to one aspect of the present invention comprises a Fabry-Perot type semiconductor laser device; and an optical fiber with an askew incident surface for the incidence of a laser beam emitted from the semiconductor laser device mentioned above.

The semiconductor laser module according to another aspect of the present invention has a semiconductor laser device which has a diffraction grating provided near an active layer which is formed between a first reflection coating provided on an emission end surface from which a laser beam is emitted and a second reflection coating provided on a reflection end surface reflecting the laser beam, which semiconductor laser device emits the laser beam including not less than two oscillation longitudinal modes within a half width of an oscillation wavelength spectrum by setting a combination of oscillation parameters which include a resonator length formed by the active laser and a wavelength selection characteristic of the diffraction grating; and an optical fiber which has an incident surface on which the laser beam is incident, the incident surface being askew polished.

These and other objects, features and advantages of the present invention are specifically set forth in or becomes apparent from the following detailed descriptions when read in conjunction with the accompanying drawings.

BRIEF DESCRIPTION OF THE DRAWINGS

FIG. 3A describes RIN characteristics with a conventional optical fiber, which is not askew polished, is employed in the first embodiment. FIG. 3B shows an RIN measurement system used for measuring the RIN characteristics.

FIG. 5 shows the RIN measurement result of the semiconductor laser module if non-reflection coatings are formed on the askew incident surfaces of an optical fiber and optical components, respectively, with an isolator of a 1.5 stage structure is implemented in the first embodiment.

FIG. 8 is a longitudinal sectional view of the semiconductor laser device shown in FIG. 7.

FIG. 9 is a cross-sectional view along with line A—A, of the semiconductor laser device shown in FIG. 7.

FIG. 10 explains wavelength selection characteristics of the diffraction grating of a semiconductor laser device implemented in the semiconductor laser module according to the first embodiment.

FIG. 11A shows a profile of a laser beam with a single longitudinal mode while FIG. 11B shows a profile of a laser beam with multiple oscillation longitudinal modes.

DETAILED DESCRIPTIONS

Embodiments of a semiconductor laser module and a Raman amplifier which employs the semiconductor laser module according to the present invention are explained hereinafter in detail with drawings. It is noted that the present invention is not limited by these embodiments.

A semiconductor laser module according to a first embodiment is explained first. The semiconductor laser module according to the first embodiment comprises a Fabry-Perot type semiconductor laser device, forms non-reflection coatings on light incident surfaces and light emission surfaces of respective optical components. In the semiconductor laser module according to the first embodiment, the incident end of an optical fiber is askew polished to thereby decrease light returning to the semiconductor laser device.

Figure 1:
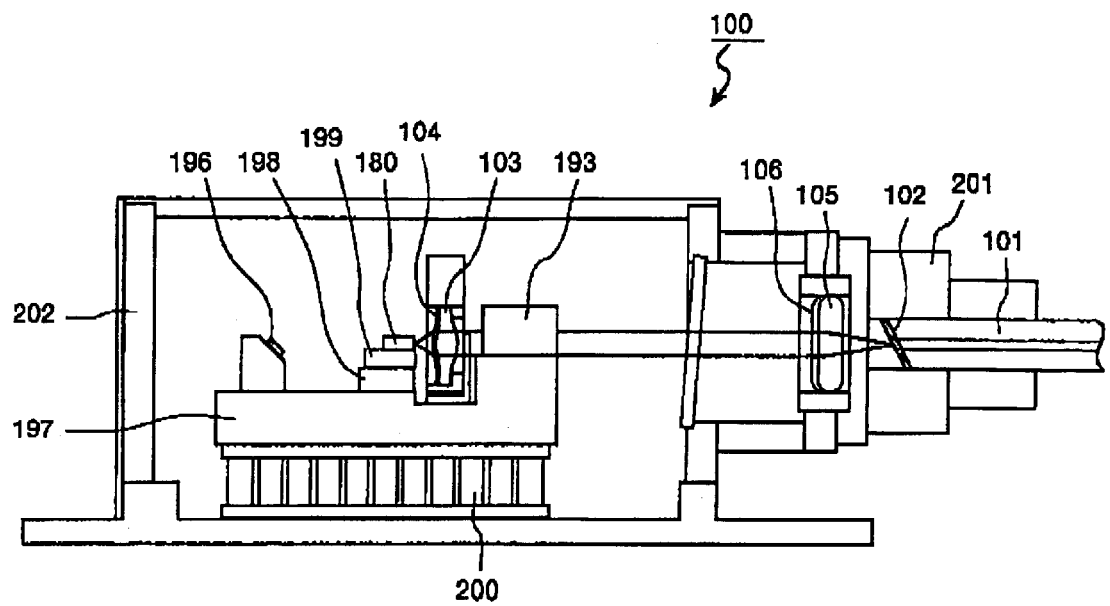
FIG. 1 is a longitudinal sectional view which shows the configuration of a semiconductor laser module according to the first embodiment.
Figure 19:
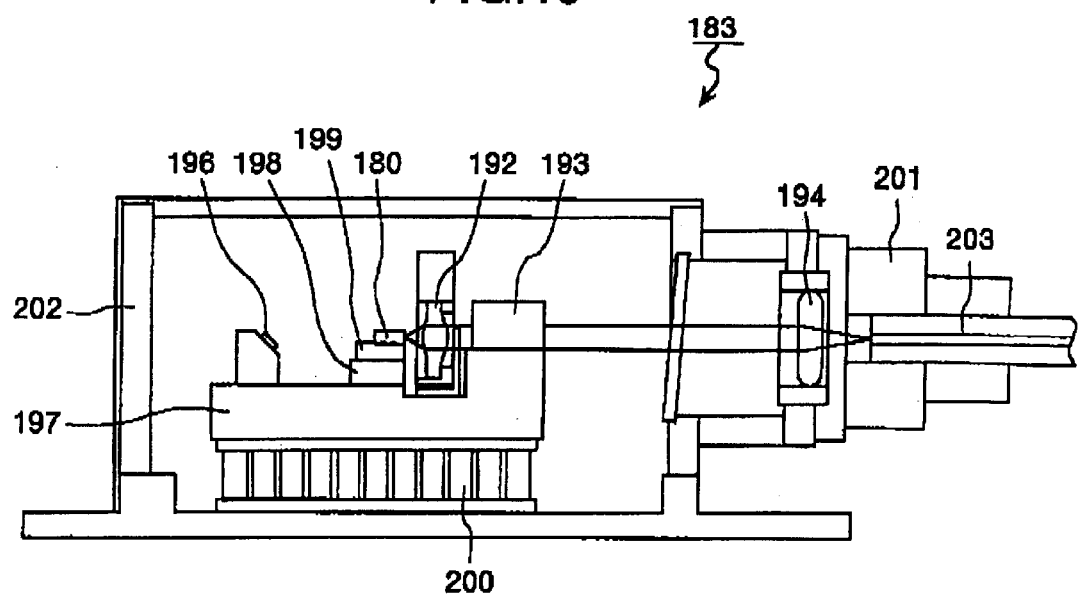
FIG. 19 is a longitudinal sectional view which shows the configuration of a semiconductor laser module employed in the conventional Raman amplifier.
Figure 20:
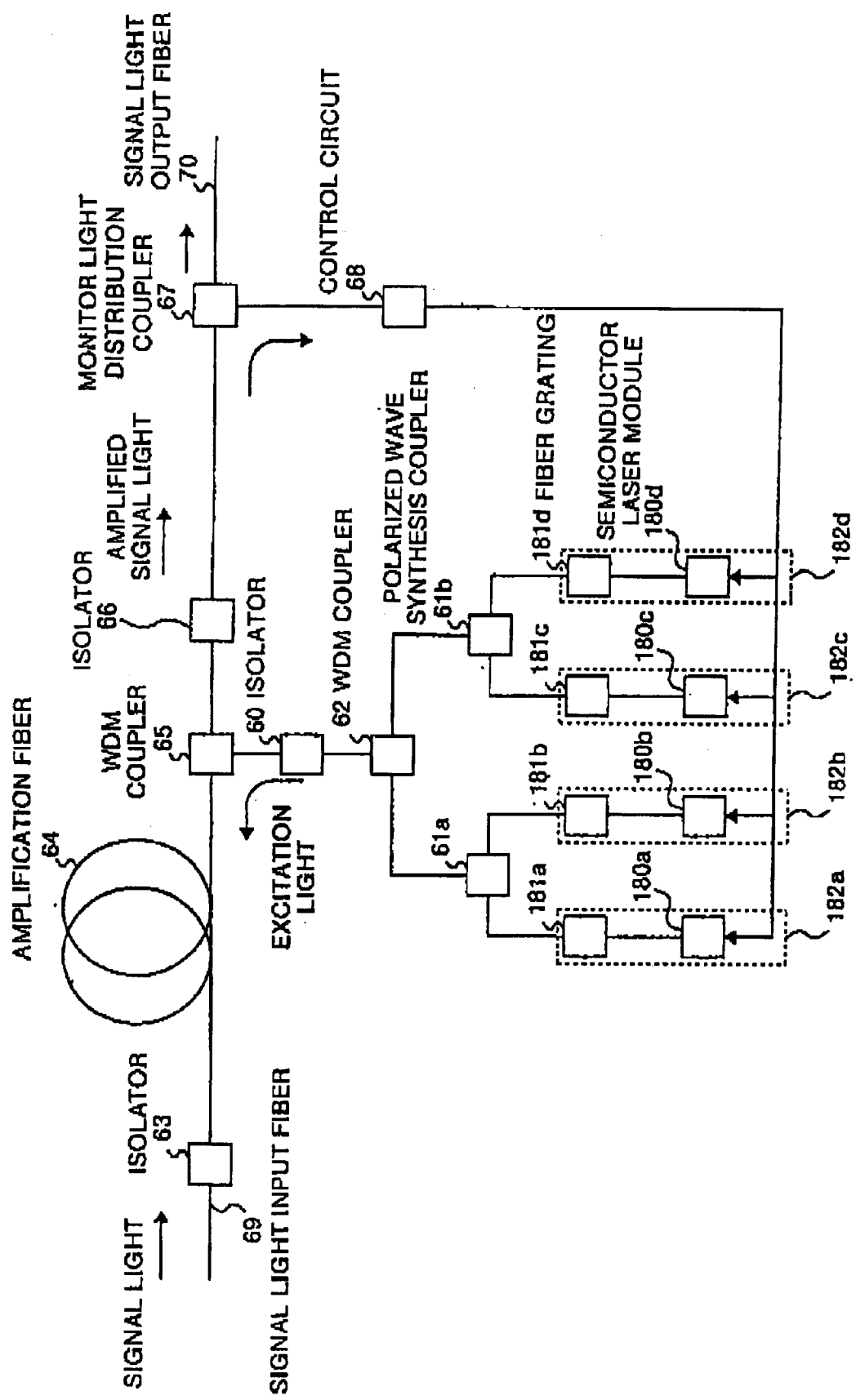
FIG. 20 is a block diagram which shows another example of the configuration of the conventional Raman amplifier employed in the DWDM transmission system.
Figure 21:
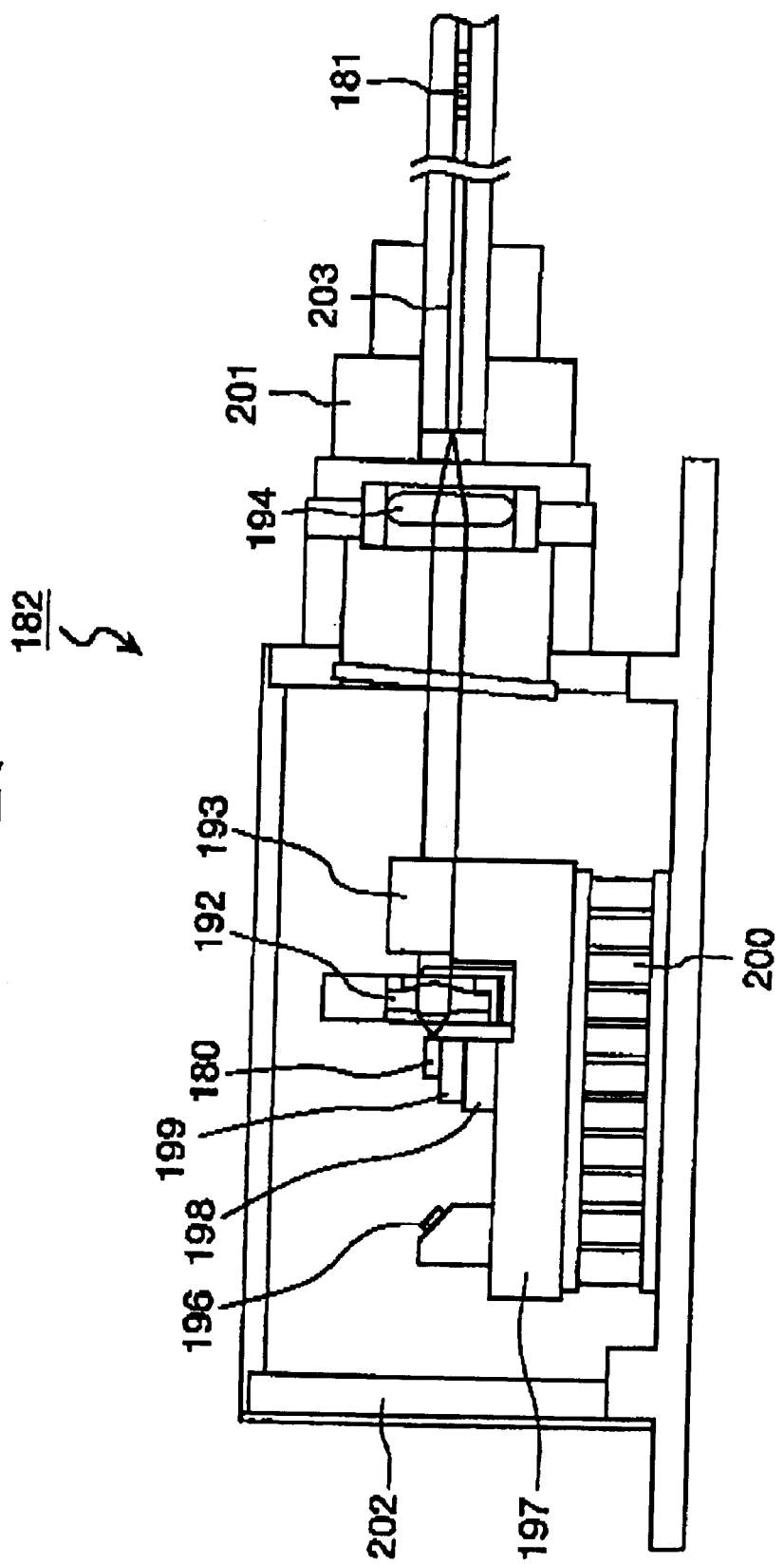
FIG. 21 is a longitudinal sectional view which shows the configuration of a semiconductor laser module employed in another example of the conventional Raman amplifier.
Figure 22:
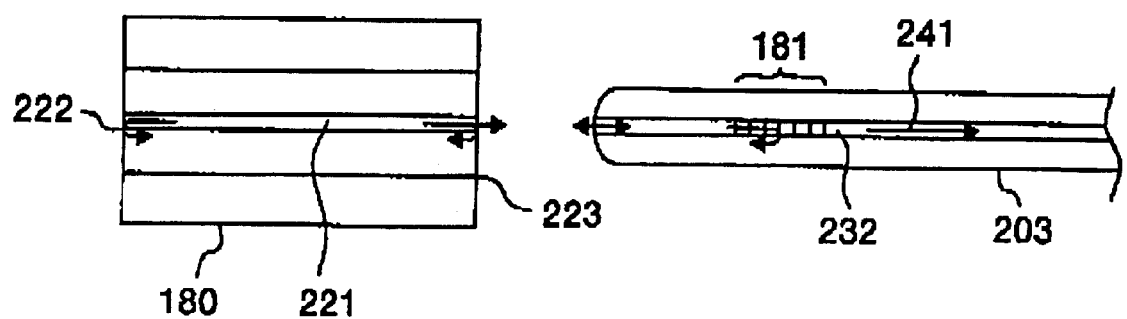
FIG. 22 explains the structure of a semiconductor laser device and the function of a fiber grating in the semiconductor laser module shown in FIG. 21.

FIG. 1 is a longitudinal sectional view which shows the configuration of the semiconductor laser module according to the first embodiment. In FIG. 1, components as same or similar structures or functions as those shown in FIG. 19 are denoted by the same reference numerals, and in order to avoid redundancy, are not be explained. A semiconductor laser module 100 shown in FIG. 1 differs from the semiconductor laser module 103 shown in FIG. 9 in that a first lens 103 which has a non-reflection coating 104 formed on a laser beam incident surface is provided in place of the first lens 192, a second lens 105 which has a non-reflection coating 106 formed on a laser beam incident surface is provided in place of the second lens 194 and an optical fiber 101 having a laser beam incident surface, which is askew to an optical axis and which has a non-reflection coating 102 formed thereon, is provided in place of the optical fiber 203 which has the laser beam incident end surface perpendicular to the optical axis.

Figure 2:
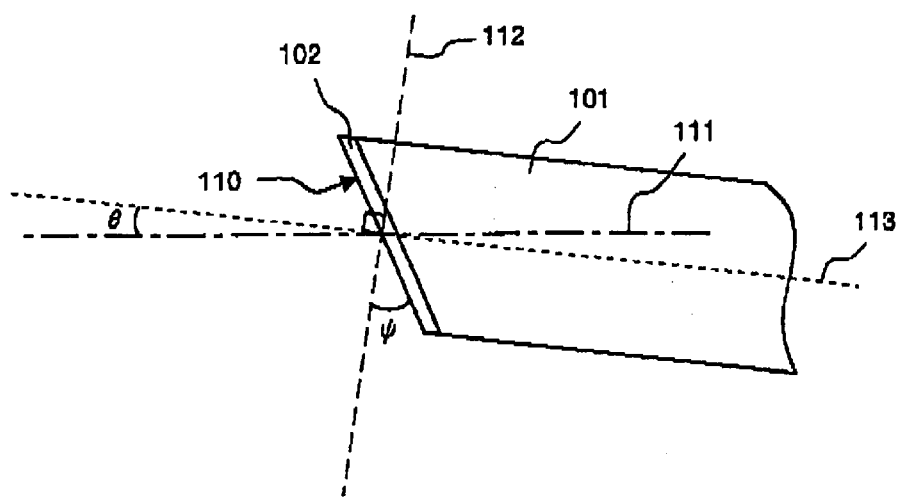
FIG. 2 explains an askew incident surface of an optical fiber.

FIG. 2 explains the askew incident surface of optical fiber. As shown in FIG. 2, the optical fiber 101 is polished askew so that an incident surface 110 has a predetermined angle ψ (e.g., 6 to 8°) with respect to an axis 112 perpendicular to a central axis 113 of the optical fiber. That is, a laser beam converged by the second lens 105 is converged on the askew incident surface 110. However, if a laser beam parallel to the central axis 113 is incident on this askew incident surface 110, the optical axis of the laser beam incident on the incident surface 110 does not coincide with the central axis 113 of the optical fiber 101 due to refraction, with the result of the increase in propagation loss.

Therefore, in refraction beam, the optical fiber 101 is fixed to the ferrule 201 (see FIG. 1) while the central axis of the optical fiber 101 is inclined with respect to the optical axis 111 of the laser beam converged by the second lens 105 so that the optical axis of the incident laser beam coincides with the central axis of the optical fiber 101. That is, as shown in FIG. 2, the optical fiber 101 is fixed to the ferrule 201 so that the central axis 113 thereof has a predetermined angle θ (e.g., 3°) with respect to the optical axis 111 of the laser beam converged by the second lens 105. Alternatively, the positions and angles of the first lens 103 and the second lens 105 may be adjusted without inclining of the optical fiber 101, so that the central axis 113 of the optical fiber 101 has the predetermined angle θ with respect to the optical axis 111 of the laser beam converged by the second lens 105.

The effect of introducing an askew incident surface of an optical fiber 101 is explained as follows. The inventors of the present application conducted an experiment in order to examine the RIN reduction effect by introducing the askew polished optical fiber. FIG. 3A shows RIN characteristics when a conventional optical fiber, which has vertical incident surface respect to the optical axis, is employed in the first embodiment. FIG. 4B shows an RIN measurement system used for the RIN characteristics measurement.

In the measurement system shown in FIG. 3B, reference numeral 142 denotes a carrier, 141 denotes a base, 140 denotes a Peltier module, 144 denotes an isolator. 146 denotes a measuring device which measures the RIN of a laser beam emitted after propagating an optical fiber 145. As a result of employing this measurement system, as shown in FIG. 3A, the RIN characteristic is deteriorated at the low frequency range with a driving current $I_{op}$ of 500 mA.

Figure 4A:
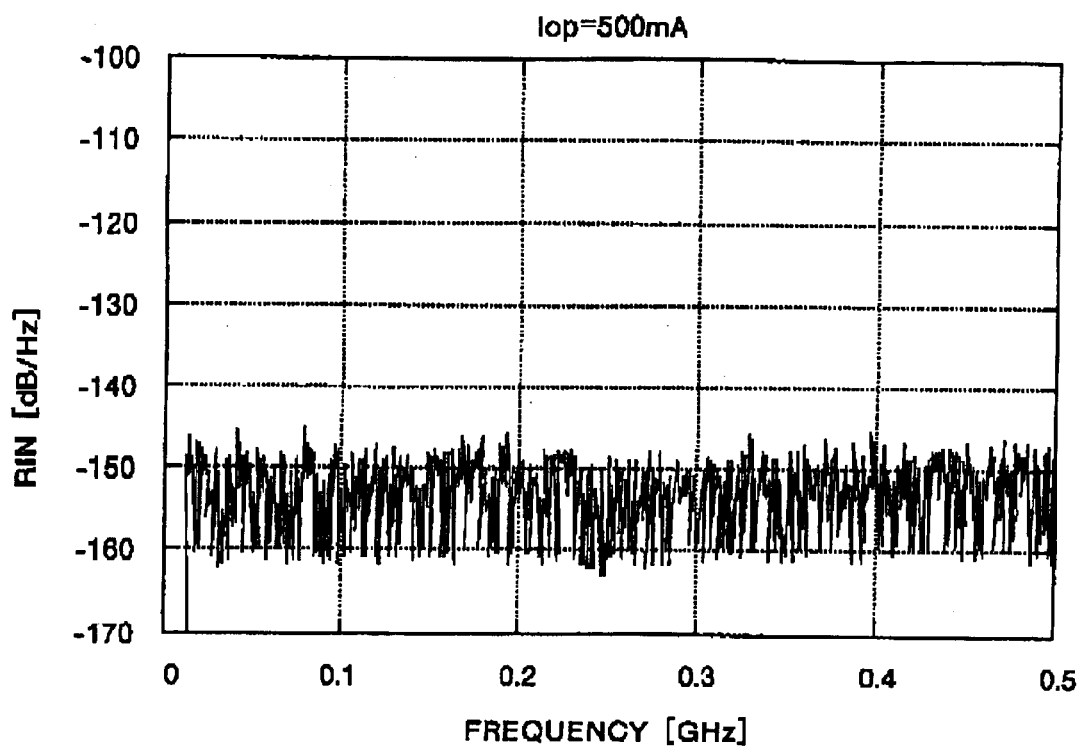
FIG. 4A shows RIN characteristics with an askew incident surface optical fiber in the first embodiment.
Figure 4B:
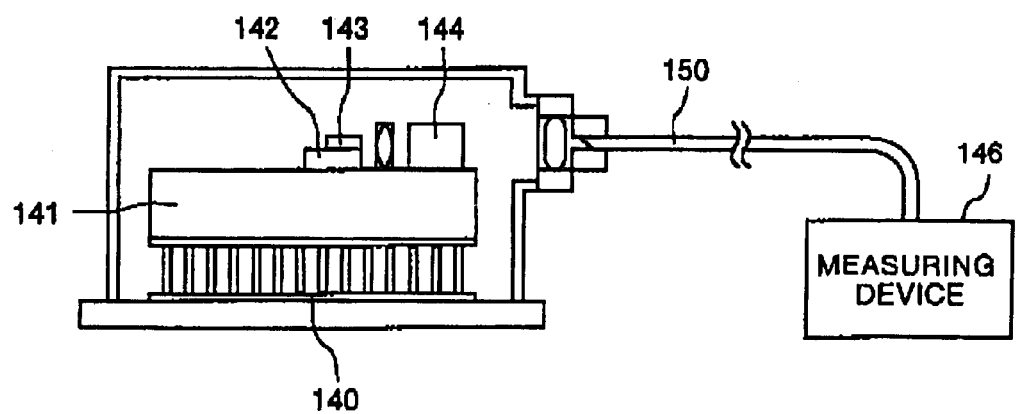
FIG. 4B shows an RIN measurment system used for measuring the RIN characteristics.

FIG. 4A shows RIN characteristics with an askew incident surface optical fiber in the first embodiment. FIG. 4B shows an RIN measurement system used for measuring the RIN characteristics. In FIG. 4B, components as same or similar structure or function as those shown in FIG. 3B are denoted by the same reference numerals, and are not explained herein in order to avoid repetition of explanation. Reference numeral 150 denotes the askew incident surface polished optical fiber according to the present invention.

As a result of employment of the askew polished optical fiber 150 (see FIG. 4B), there is no deterioration of the RIN characteristic which is seen in FIG. 3A. The inventor(s) has, therefore, reached the conclusion that the use of the askew polished optical fiber 101 realizes RIN reduction due to the fact that the reflected light of the laser beam is deviated from a return light direction by the optically, askew polished incident surface and this is backed up by the comparison experiment.

In the semiconductor laser module according to the first embodiment, the non-reflection coatings 104, 106 and 102 are formed on the first lens 103, the second lens 105 and the optical fiber 101, respectively, in order to realize further RIN reduction, i.e., by decreasing return light from the semiconductor laser device 180. Through the presence of these non-reflection coatings, the laser beam emitted from the semiconductor laser device 180 is hardly reflected by the incident surfaces of the first lens 103, the second lens 105 and the optical fiber 101, respectively, and the quantity of the return light to the semiconductor laser device 180 is greatly decreased. Consequently, it is possible to further reduce RIN.

As the isolator 193, it is preferable to employ an isolator of a 1.5-stage structure (deflector/Faraday rotator/deflector/Faraday rotator/deflector) or a structure of more stages (e.g., loss of 0.3 dB to 0.5 dB). In addition, the isolator 193 is preferably arranged to be inclined with respect to the optical axis by about 4°. Further, a non-reflection coating may be formed on the incident surface of this isolator 193. These can further ensure decreasing the return light. Furthermore, a non-reflection coating may be formed on the emission-side surface of the isolator 193 to improve transmittance.

Figure 23:
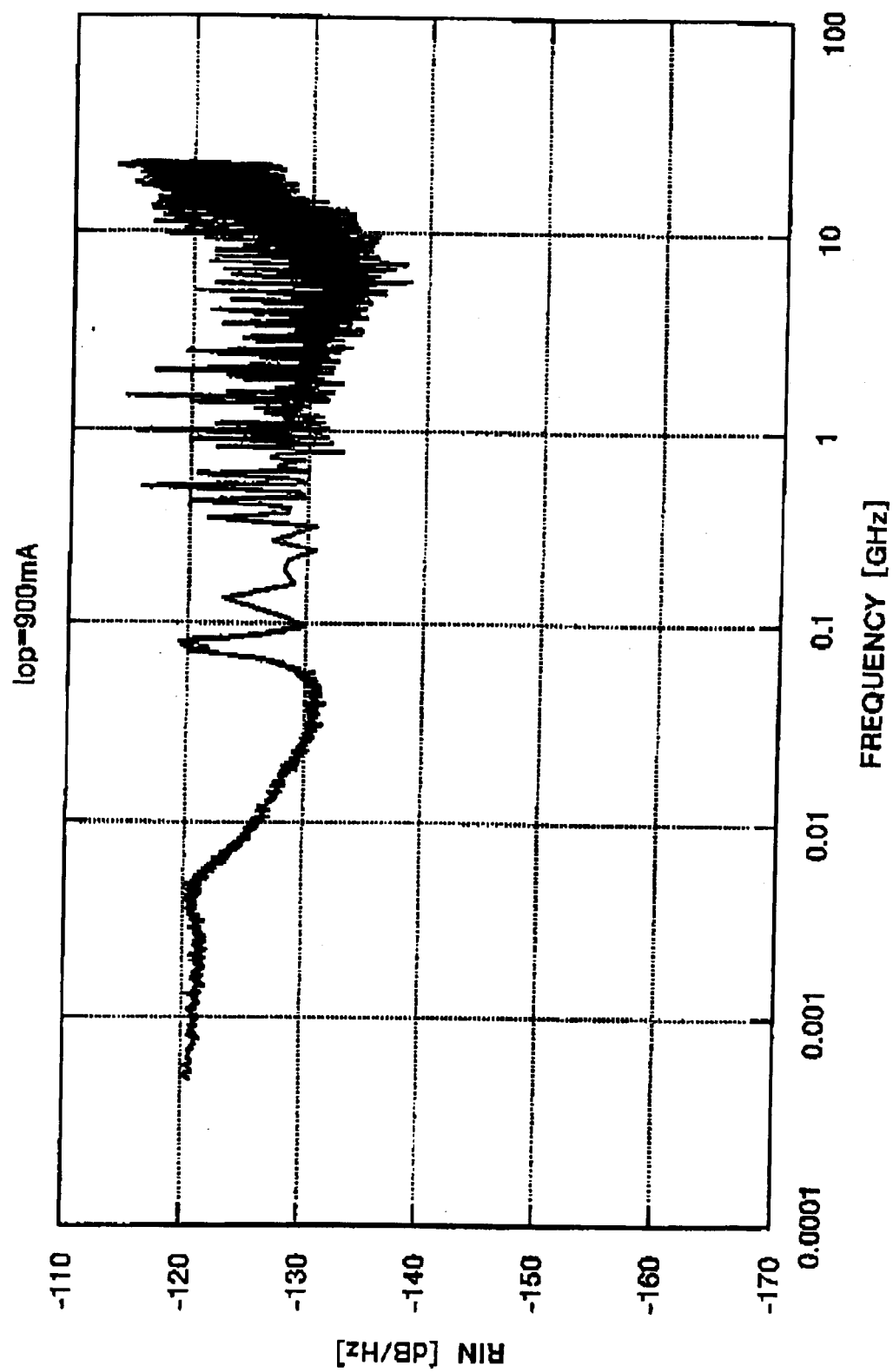
FIG. 23 shows the RIN measurement result of the semiconductor laser module shown in FIG. 21.
Figure 24:
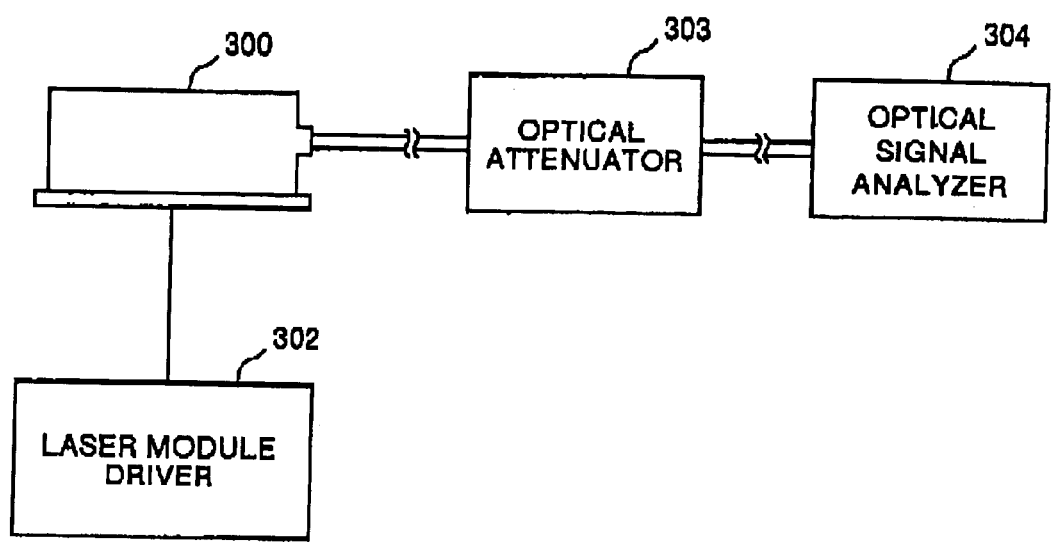
FIG. 24 shows a measurement system of RIN characteristics.

FIG. 5 shows an RIN measurement result for the semiconductor laser module if the askew polished optical fiber is employed, the non-reflection coatings are formed on the first lens 103, the second lens 105 and the optical fiber 101, respectively and the isolator 193 of a 1.5-stage structure is employed in FIG. 1. It is noted that the measurement system and the measurement conditions are as same as those used in the measurement system in FIG. 23. However, the driving current $I_{op}$ is set at $I_{op}$=500 mA. As a result of employing this measurement system, as shown in FIG. 5 good RIN characteristic is obtained in the entire frequency range including a low frequency range, compared with the RIN measurement result shown in FIG. 23.

As explained above, it is possible to prevent the reflected beam generated at the incident surface from entering the semiconductor laser device 180 by using the askew incident surface optical fiber 101 in the first embodiment.

Consequently, it is possible to suppress the deterioration of the RIN characteristic and to provide a highly reliable, stable laser beam.

According to the semiconductor laser module in the first embodiment, the non-reflection coatings are formed on the incident surfaces of the optical components including the optical fiber 101 which constitute the module, respectively. It is, therefore, possible to further decrease the occurrence of the return light and to further ensure suppressing the deterioration of the RIN characteristic.

A semiconductor laser module according to a second embodiment is explained as follows, The semiconductor laser module according to the second embodiment is constituted by comprising a semiconductor laser device which includes a grating and which outputs a laser beam having a plurality of longitudinal modes within a predetermined threshold, and realizing high output and the elimination of the fiber grating. Further, the semiconductor laser module according to the first embodiment is constituted by forming non-reflection coatings on the incident surfaces of optical components, respectively, askew incident end of an optical fiber and thereby decreasing return light to the semiconductor laser device.

Figure 6:
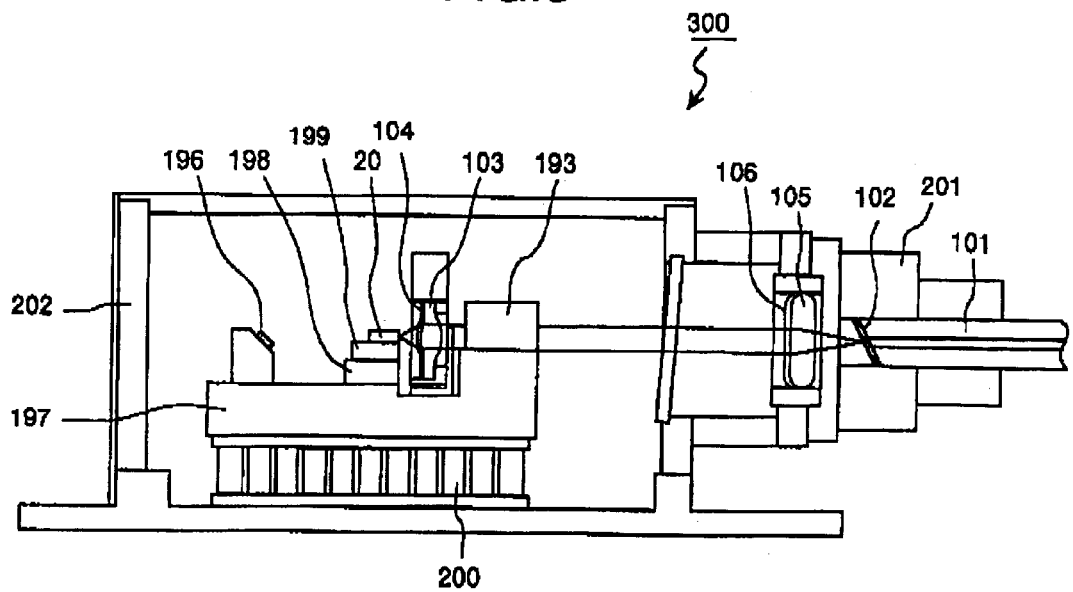
FIG. 6 is a longitudinal sectional view which shows the configuration of a semiconductor laser module according to the second embodiment.

FIG. 6 is a longitudinal sectional view which shows the configuration of the semiconductor laser module according to the second embodiment. In FIG. 6, components having same or similar structure or function as those shown in FIG. 1 have been denoted by the same reference numerals, and to avoid repetition of explanation, their explanation will be omitted. The semiconductor laser module 300 shown in FIG. 6 differs from the semiconductor laser module 100 shown in FIG. 1 in that a semiconductor laser device 20 to be explained later is provided in place of the Fabry-Perot type semiconductor laser device 180.

Figure 7:
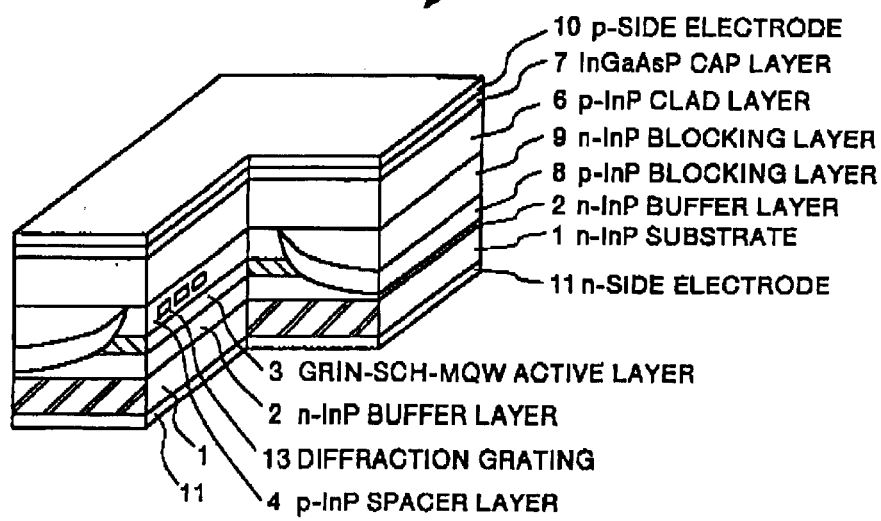
FIG. 7 is a perspective broken-out view which shows the configuration of a semiconductor laser device in the semiconductor laser module according to the second embodiment.

The structure and feature of the semiconductor laser device 20 will be explained. FIG. 7 is a perspective broken-out view which shows the schematic configuration of a semiconductor laser device in the semiconductor laser module according to the second embodiment. FIG. 8 is a longitudinal sectional view of the semiconductor laser device shown in FIG. 7. FIG. 9 is a cross-sectional view taken along line A—A, of the semiconductor laser device shown in FIG. 7. In FIG. 7, the semiconductor laser device 20 comprises an n-InP buffer layer 2 which serves as both an n-InP buffer layer and a lower clad layer, a GRIN-SCH-MQW (Granded Index-Separate Confinement Heterostructure Multi Quantum Well) active layer 3 which has a compression distortion, a p-InP spacer layer 4, a p-InP clad layer 6 and an InGaAsP cap layer 7. These layers are provided in this order on a (100) plane of an n-InP substrate 1.

A diffraction grating 13 is formed in the p-InP spacer layer 4 as is explained later. The upper portions of the p-InP spacer layer 4 which includes this diffraction grating 13, the GRIN-MQW active layer 3 and the n-InP buffer layer 2 are processed to have mesa stripes. The both sides of the mesa stripes are embedded by a p-InP blocking layer 8 and an n-InP blocking layer 9 which are formed as current blocking layers, respectively. In addition, a p-side electrode 10 is formed on the upper surface of an InGaAsP contact layer 7 while an n-side electrode 11 is formed on the rear surface of the n-InP substrate 1.

As shown in FIG. 8, a reflection coating 14 which has a high reflectivity of not less than 80% is formed on the optical reflection end surface of the semiconductor laser device 20 which surface is one end surface in a longitudinal direction thereof. An emission-side reflection coating 15 which has a low light reflectivity of not more than 2%, preferably not more than 1% is formed on the emission end surface which is the other end surface. The light generated in the GRIN-SCH-MQW active layer 3 of a light resonator formed by the reflection coating 14 and the emission-side reflection coating 15 is reflected by the reflection coating 14 and emitted as a laser beam through the emission-side reflection coating 15.

The functions of the respective layers will be briefly explained. The n-InP buffer layer 2 has a function as a clad layer besides that as a buffer layer. Specifically, the n-InP buffer layer 2 has a lower refractive index than the effective refractive index of the GRIN-SCH-MQW active layer 3, where by the n-InP buffer layer 2 functions to confine the light generated from the GRIN-SCH-MQW active layer 3 in a longitudinal direction.

The p-InP current block layer 8 and the n-InP current block layer 9 function to constrict an injected current inside. In the semiconductor laser according to the second embodiment, the p-side electrode 10 functions as an anode. Therefore, if a voltage is applied, a reverse bias is applied to a portion between the n-InP current block layer 9 and the p-InP current block layer 8. As a result, no current is carried from the n-InP current block layer 9 toward the p-InP current block layer 8, and the current injected from the p-side electrode 10 is constricted and caused to flow in the GRIN-SCH-MQW active layer 3 at high density. The flow of the current in the layer 3 at high density enables carrier density in the GRIN-SCH-MQW active layer 3 to increase and light emission efficiency to improve.

The selection of an oscillation longitudinal mode by the diffraction grating 13 will be explained. Although the number of oscillation longitudinal modes selected by the diffraction grating 13 may be one in the first embodiment. A case such that the diffraction grating 13 selects a plurality of oscillation longitudinal modes is explained herein. In addition, the advantage of selecting a plurality of oscillation longitudinal modes is explained.

The diffraction grating 13 has a coating thickness of 20 nm, is formed periodically at a pitch of about 220 nm over a length Lg=50 $\mu$m from the low reflection coating 15 side toward the high reflection coating 14 side. The diffraction grating 13 selects a laser beam of a central wavelength of 1.48 $\mu$m. The diffraction grating 13 enables providing good linearity of driving current-light output characteristic and enhancing the stability of light output by setting a multiplication value obtained by multiplying the coupling coefficient K by a diffraction grating length Lg (see Japanese Patent Application No. 2001-134545). In addition, if the resonator length L is 1300 $\mu$m and the diffraction grating length Lg is not more than about 300 $\mu$m, the laser beam oscillates in a plurality of oscillation longitudinal modes. It is, therefore, preferable that the diffraction grating length Lg is set at not more than about 300 $\mu$m. Meanwhile, since the oscillation longitudinal mode interval changes in proportion to the change of the resonator length L, the diffraction grating length Lg is proportional to the resonator length L. That is, to maintain the relationship of (diffraction grating length Lg):(resonator length L)=300:1300, the relationship in which a plurality of oscillation longitudinal modes are obtained at the diffraction grating length Lg of not more than 300 $\mu$m can be extended as follows:

$$Lg \times (1300\ (\mu m)/L) \leq 300\ (\mu m).$$

That is, the diffraction grating length Lg is set to maintain the ratio thereof to the resonator length L to be not more than (300/1300) times as large as the resonator length L (see Japanese Patent Application No. 2001-134545). In addition, as explained in Japanese Patent Application No. 2001-134545, the diffraction grating 13 may be formed in a grating period so as to have a predetermined periodic fluctuation or to have a change at random or in a predetermined period.

It is desirable that the diffraction grating 13 is arranged to contact with the emission-side reflection coating 15. However, if not arranged to contact with the emission-side reflection coating 15, the diffraction grating 13 can be arranged to be away from the emission-side reflection coating 15 in a range of, for example, about 20 µm to 100 µm. In addition, the diffraction grating 13 may remain on the reflection coating 14, depending on the irregularity of the cleavage position of the semiconductor laser device 20 which occurs during the manufacturing of the semiconductor laser device 20. Further, this diffraction grating 13 may be arranged over the entire surface of the active layer or a part thereof.

As shown in FIG. 9, the upper portion of the n-InP buffer layer 2, the GRIN-SCH-MQW active layer 3 and the p-InP spacer layer 4 which includes the diffraction grating 13 are processed to have mesa stripes. The both sides of the mesa stripes are embedded by the p-InP blocking layer 8 and the n-InP blocking layer 9 which are formed as current blocking layers, respectively. The p-side electrode 10 is formed on the upper surface of the InGaAsP cap layer 7 while the n-side electrode 11 is formed on the rear surface of the n-InP substrate 1.

If the semiconductor laser device 20 is employed as the excitation light source of the Raman amplifier, the oscillation wavelength thereof is set at 1100 nm to 1550 nm and the resonator length L is set at not less than 800 µm and not more than 3200 µm. Generally, the mode interval $\Delta\lambda$ of the longitudinal modes generated by the resonator of a semiconductor laser device can be expressed by the following equation where an equivalent refraction index is "n".

$$\Delta\lambda = \lambda_o^2/(2 \cdot n \cdot L).$$

If the oscillation wavelength $\lambda_o$ is 1480 nm and an effective refractive index is 3.5, the mode interval $\Delta\lambda$ of longitudinal modes is about 0.39 nm at the resonator length L of 800 µm and about 0.1 nm at the resonator length L of 3200 µm. That is, the larger the resonator length L is, the narrower the mode interval $\Delta\lambda$ of longitudinal modes becomes, making stricter selection conditions for oscillating a laser beam having a single longitudinal mode.

The selection wavelength characteristic of this diffraction grating 13 is expressed as an oscillation wavelength spectrum 30 shown in FIG. 10. As shown in FIG. 10, in the semiconductor laser device 20, a plurality of oscillation longitudinal modes are present within the wavelength selection characteristic indicated by a half width $\Delta\lambda h$ of the oscillation wavelength spectrum 30 particularly due to the diffraction grating 13 described above. In FIG. 10, three oscillation longitudinal modes 31 to 33 are present within the half width $\Delta\lambda h$ of the oscillation wavelength spectrum. In the conventional semiconductor laser device, if the resonator length L is set at not less than 800 µm, it is difficult to oscillate a laser beam in a single longitudinal mode. Therefore a semiconductor laser with a resonator length L has not been employed. In this semiconductor laser device 20, by actively setting the resonator length L to be not less than 800 µm, a laser beam including a plurality of oscillation longitudinal modes within the half width $\Delta\lambda h$ of the oscillation wavelength spectrum is emitted.

It a laser beam having a plurality of oscillation longitudinal modes is employed, it is possible to suppress the peak of laser emission and to obtain a high laser output power, compared with the use of a laser beam having a single longitudinal mode. FIG. 11A shows a profile of a laser beam having a single longitudinal mode and FIG. 11B shows a profile of a laser beam having multiple oscillation longitudinal modes. This semiconductor laser device 20 has a profile shown in FIG. 11B, for example and can obtain high laser output at a low peak. On the other hand, FIG. 11A shows the profile of a semiconductor laser which oscillates a laser beam in a single longitudinal mode if the same laser output is obtained. As shown, a high peak is present.

If the semiconductor laser device 20 is employed as the excitation light source of the Raman amplifier, it is preferable to increase excitation light output power so as to obtain high Raman gain. However, if the output has a high peak, induced Brillouin scattering occurs, and increases noise. As shown in FIG. 11A, the induced Brillouin scattering occurs if the laser output exceeds a threshold Pth at which occurs. Considering this, the semiconductor laser device 20 emits a laser beam in a plurality of oscillation longitudinal modes with the peak suppressed to be not more than the threshold Pth of the induced Brillouin scattering as shown in FIG. 11B so as to obtain as same laser output power as that of the profile shown in FIG. 11A. It is thereby possible to obtain a high excitation light output power. As a result, it is possible to obtain high Raman gain.

In FIG. 10, the wavelength interval (mode interval) $\Delta\lambda$ of the oscillation longitudinal modes 31 to 33 is set at not less than 0.1 nm. The reason of setting is as follows. If the semiconductor laser device 20 is utilized for the source of the excitation light of the Raman amplifier and its mode interval $\Delta\lambda$ is not more than 0.1 nm, the probability of occurrence of induced Brillouin scattering increases. As a result, according to the equation of the mode distance $\Delta\lambda$, it is preferable that the resonator length L is not more than 3200 µm. From these viewpoints, it is preferable that the number of oscillation longitudinal modes included within the half width $\Delta\lambda h$ of the oscillation wavelength spectrum 30 is two or more.

Therefore, as explained above, in the semiconductor laser device 20 which is provided in the semiconductor laser module according to the second embodiment, the position at which the diffraction grating 13 is arranged and the resonator length L are set so that not less than two oscillation longitudinal modes are included within the half width of the oscillation wavelength spectrum. It is, therefore, possible to stably obtain high output laser power without causing induced Brillouin scattering.

As the semiconductor laser device provided in the semiconductor laser module according to the second embodiment, the semiconductor laser devices explained in the embodiments of Japanese Patent Application Nos. 2000-323118, 2001-134545 and 2001-228669 as well as the semiconductor laser device constituted as explained above are available.

Figure 12A:
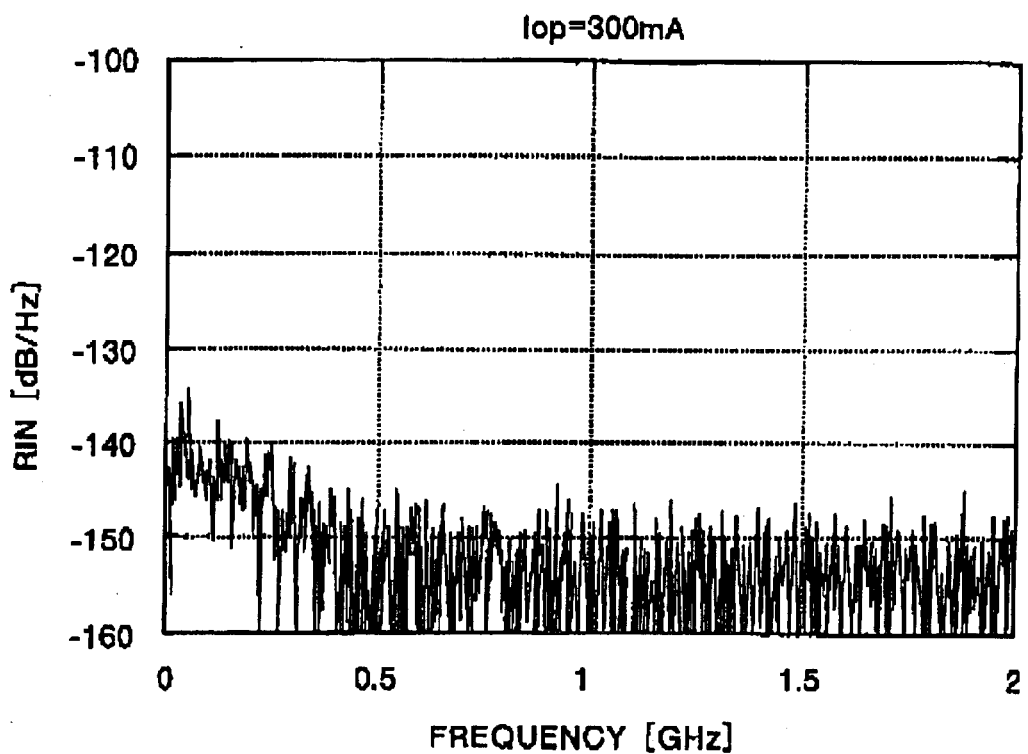
FIG. 12A shows RIN characteristics with a conventional optical fiber, which is not askew polished, in the second embodiment.

The optical fiber 101 which is employed in the semiconductor laser module according to the second embodiment is explained. This optical fiber 101 is also an askew polished optical fiber similarly to that shown in FIG. 2 and the method for fixing the optical fiber 101 is as same as one explained in the first embodiment, The effect of introducing the askew polished optical fiber 101 in the second embodiment is explained. The inventors of the present application conducted a comparison experiment in order to examine the RIN reduction effect by introducing the askew polished optical fiber. FIG. 12A shows RIN characteristics when a conventional optical fiber, which is not askew polished, is employed in the second embodiment and FIG. 12B shows an RIN measurement system used for measuring the RIN characteristics.

Figure 12B:
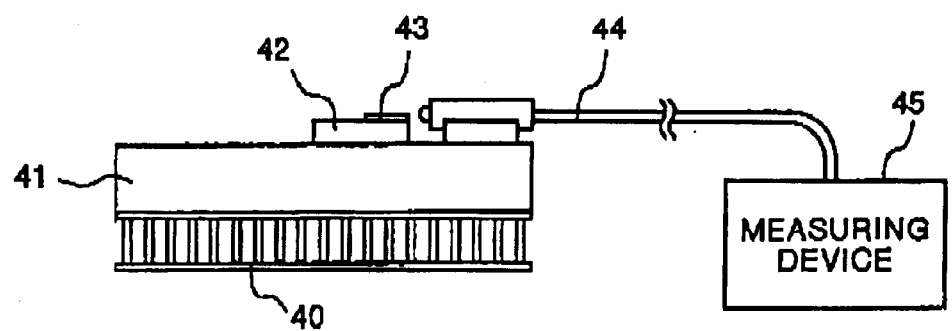
FIG. 12B shows an RIN measurement system for the RIN characteristics measurement.

In the measurement system shown in FIG. 12B, a spherical-tip fiber 44 which also functions to converge a laser beam emitted from the semiconductor laser device 43 is employed to measure the RIN characteristic of the semiconductor laser module when the conventional optical fiber with is not askew polished is employed. The spherical-tip optical fiber 44 has a semispherical shaped incident surface which functions as a lens. In FIG. 12B, reference numeral 42 denotes a carrier, 41 denotes a base, 40 denotes a Peltier module, and 45 denotes a measuring device which measures the RIN of a laser beam emitted after propagating the spherical-tip optical fiber 44. As a result of employing this measurement system, as shown in FIG. 12A, the RIN characteristic is increased at a low frequency range with a driving current $I_{op}$=300 mA.

Figure 13A:
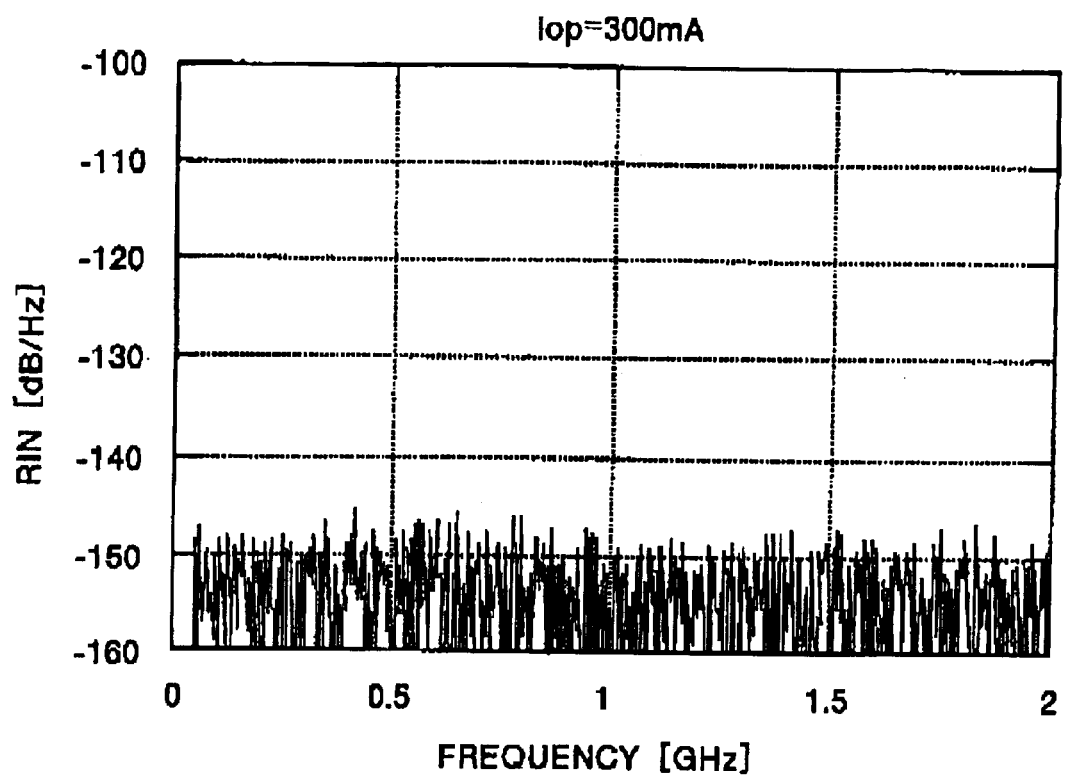
FIG. 13A shows RIN characteristics when an askew incident surface of an optical fiber in the second embodiment.
Figure 13B:
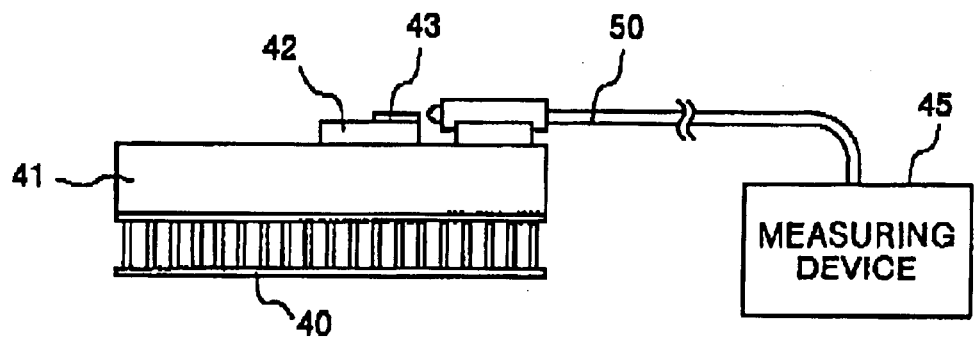
FIG. 13B shows an RIN measurement system used for measuring the RIN characteristics measurement.

FIG. 13A shows RIN characteristics when an askew polished optical fiber is employed in the second embodiment, FIG. 13B shows an RIN measurement system used for measuring the RIN characteristics. In FIG. 13B, components as same or similar structure or function as those shown in FIG. 12B have been denoted by the same reference numerals, so as the explanation is omitted.

In the measurement system shown in FIG. 13B, a askew wedged optical fiber 50 which also functions to converge a laser beam emitted from the semiconductor laser device 43 and the incident surface of which is partially askew polished is employed in order to measure the RIN characteristic of the semiconductor laser module if the askew polished optical fiber is employed while minimizing the difference of this measurement system from that shown in FIG. 12B. As a result of employing this measurement system, the increase of the RIN characteristic at the low frequency range which is seen in FIG. 12A does not occur when a driving current $I_{op}$=300 mA.

The inventors have, therefore, reached the conclusion that the use of the askew wedged optical fiber 101 realizes RIN reduction from the fact that the reflected light of the laser beam is deviated from a return light by utilizing the optically, askew incident surface. This is backed up by the comparison experiment.

Figure 14:
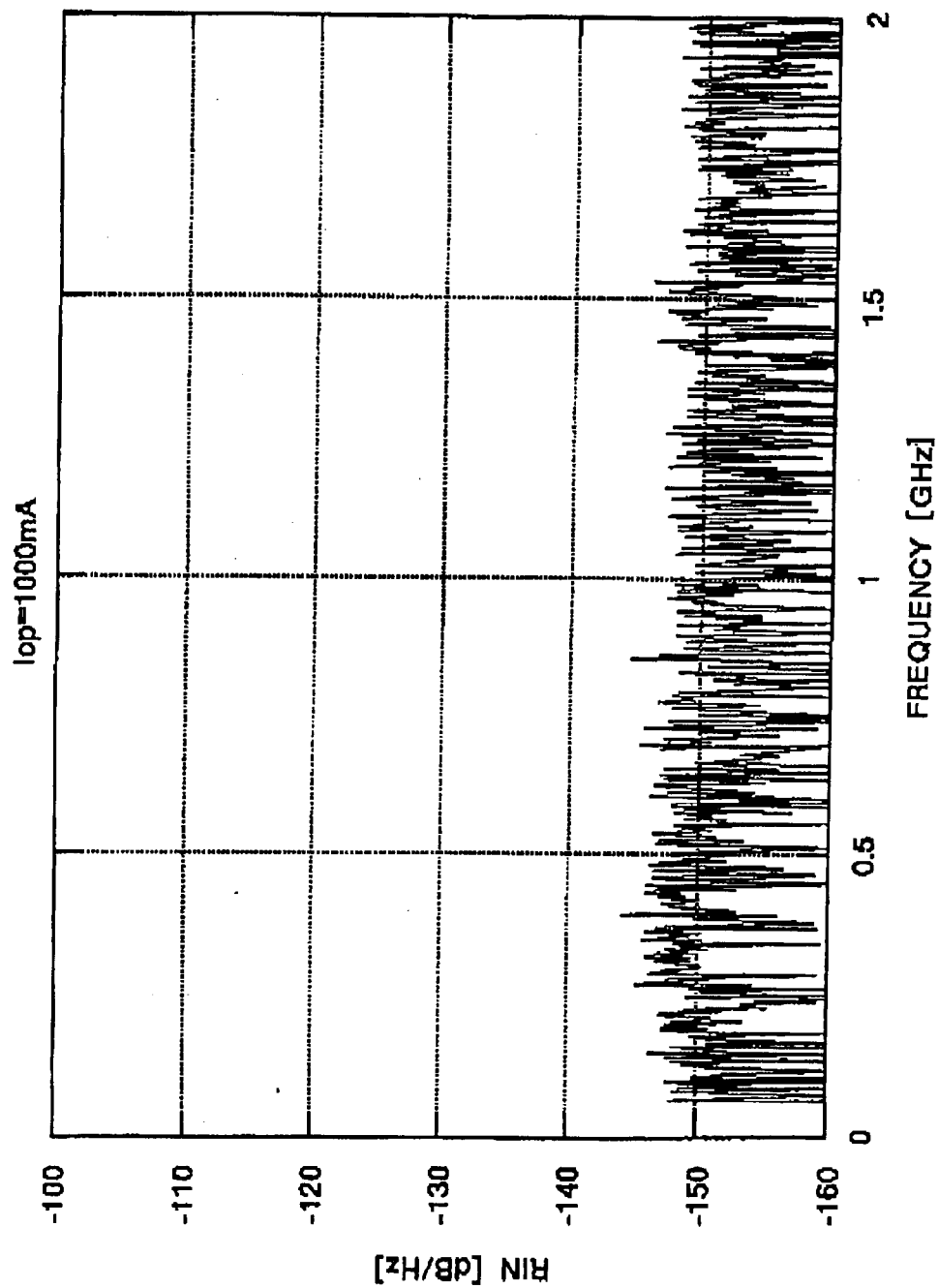
FIG. 14 shows the RIN characteristic of the semiconductor module according to the second embodiment.

FIG. 14 shows the RIN characteristic of the semiconductor laser module according to the second embodiment. It is noted, however, that the RIN characteristic shown in FIG. 14 is that of a semiconductor laser module in which non-reflection coatings 104, 106 and 102 are formed on the first lens 103, the second lens 105 and the optical fiber 101 shown in FIG. 5, respectively so as to evaluate the RIN reduction effect obtained by askew polishing the optical fiber and that the RIN characteristic is measured at a driving current $I_{op}$=1000 mA. As shown in FIG. 14, there is no large RIN at a low frequency range as seen in FIG. 12A, which demonstrates that RIN reduction is realized by employing askew polishing the optical fiber.

In the semiconductor laser module according to the second embodiment, the non-reflection coatings 104, 106 and 102 are formed on the first lens 103, the second lens 105 and the optical fiber 101 shown, respectively as explained in the first embodiment. Through the presence of these non-reflection coatings, the laser beam emitted from the semiconductor laser device 20 is hardly reflected by the incident surfaces of the first lens 103, the second lens 105 and the optical fiber 101, respectively, and the amount of the return light towards to the semiconductor laser device 20 is greatly decreased. Consequently, it is possible to further reduce RIN.

The semiconductor laser device 20 has been explained when the reflectivity of the emission-side reflection coating 15 is not more than 2%, preferably as low as not more than 1%. Conversely, the reflectivity thereof can be set to be not less than 1%. By setting so, even if the return light reaches to the emission side of the semiconductor laser device 20, it is possible to further reflect the return light at the higher reflectivity and to thereby prevent the return light from entering the semiconductor laser device 20. In addition, as the isolator 193, the same isolator as that in the first embodiment can be employed.

Figure 15:
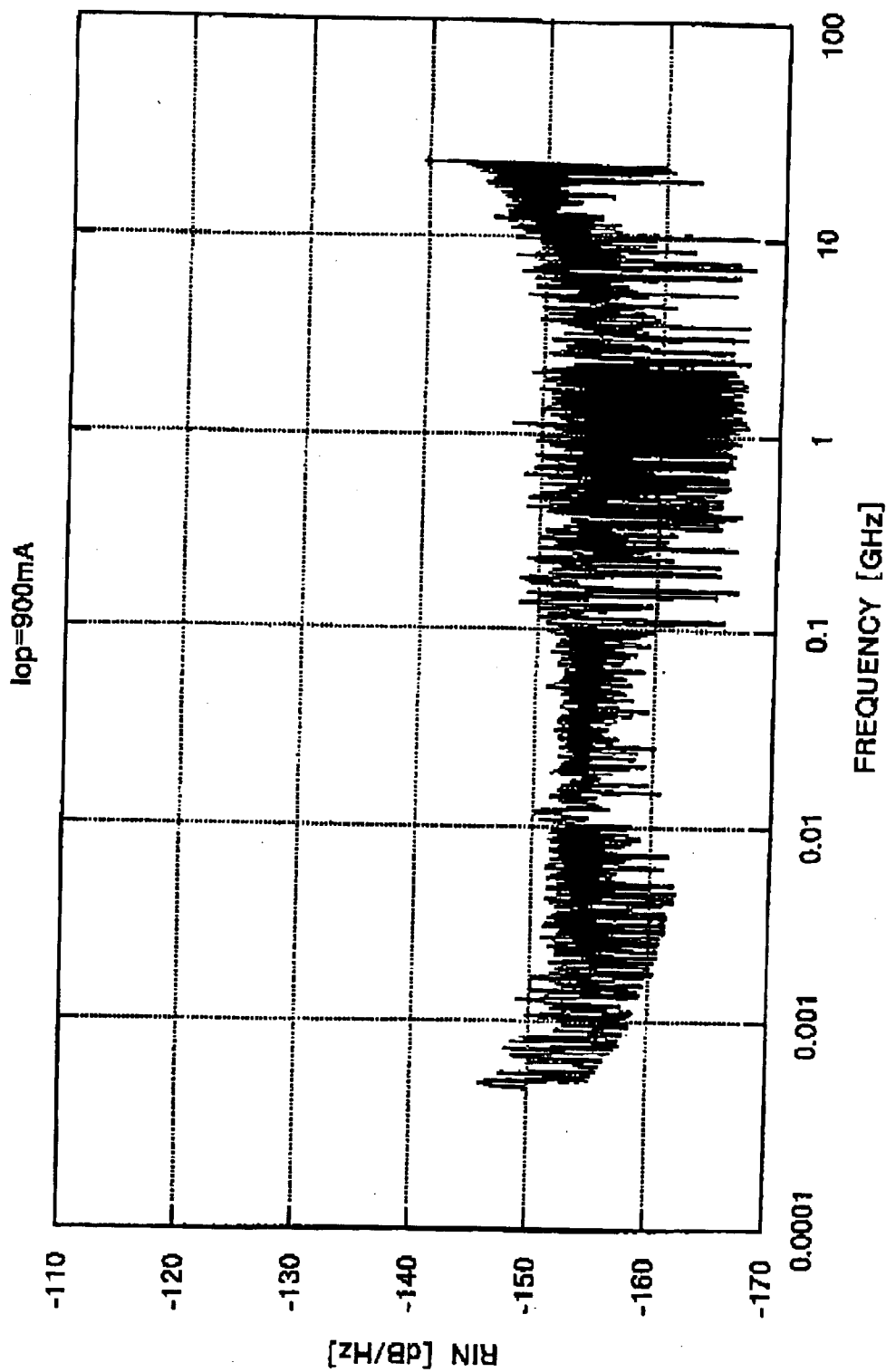
FIG. 15 shows the RIN measurement result of the semiconductor laser module when non-reflection coatings are formed on the incident surfaces of the askew incident surface of an optical fiber and optical components, respectively, and an isolator of a 1.5 stage structure in the second embodiment.

FIG. 15 shows an RIN measurement result for the semiconductor laser module if the askew wedged optical fiber is employed, the non-reflection coatings are formed on the first lens 103, the second lens 105 and the optical fiber 101, respectively and the isolator 193 of a 1.5-stage structure is employed as shown in FIG. 6. It is noted that the measurement system and the measurement conditions are as same as those used in the measurement system shown in FIG. 23. However, the driving current $I_{op}$ is set at 900 mA. As a result of employing this measurement system, good RIN characteristic is obtained in an entire frequency range including a low frequency range, compared to the result of RIN measurement shown in FIG. 23, as shown in FIG. 15.

As explained so far, according to the semiconductor laser module in the second embodiment, the optical fiber 101 which has the incident end askew polished is employed in the semiconductor laser module which includes the semiconductor laser device which outputs a laser beam in a plurality of oscillation longitudinal modes within the threshold at which induced Brillouin scattering occurs. It is, therefore, possible to prevent the reflected light generated on the incident end surface from entering the semiconductor laser device 20 as return light. Consequently, it is possible to suppress the deterioration of the RIN characteristic and to provide a highly reliable, stable laser beam.

According to the semiconductor laser module in the second embodiment, the non-reflection coatings are formed on the light incident surfaces of the optical components including the optical fiber 101 which constitute the module, respectively. It is, therefore, possible to further decrease the occurrence of the return light and to further ensure suppressing the deterioration of the RIN characteristic.

In the second embodiment, a case such that the oscillation wavelength $\lambda_o$ of the semiconductor laser device 20 is 1480 nm has been explained. Needless to say, the present invention is also applicable to a case such that a semiconductor laser device having the other oscillation wavelength such as 980 nm is provided.

A Raman amplifier according to a third embodiment will be explained. The Raman amplifier according to the third embodiment is constituted by employing, as a semiconductor laser module which constitutes the excitation light source of the amplifier, the semiconductor laser module shown in the first or second embodiment.

Figure 16:
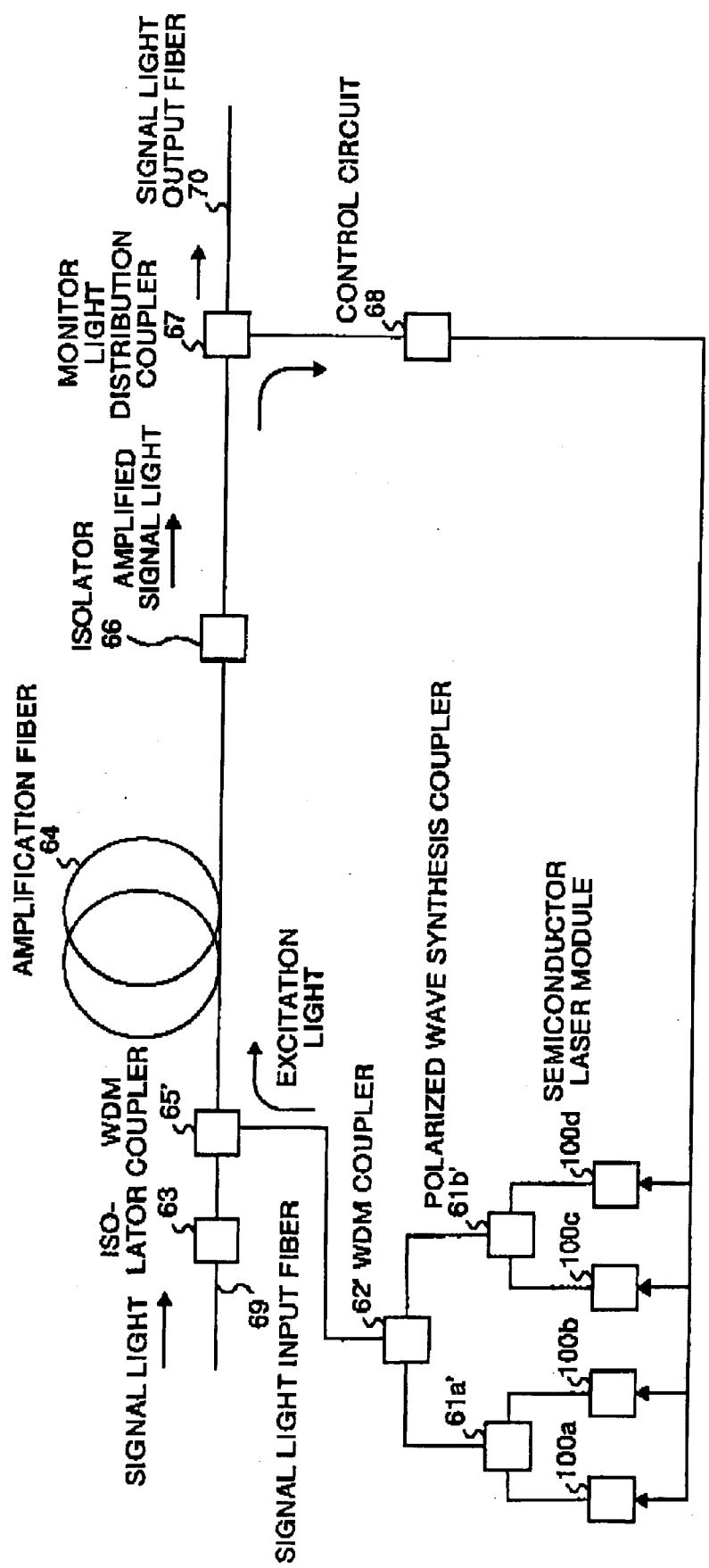
FIG. 16 is a block diagram of the configuration of a Raman amplifier, which employs forward excitation, according to the third embodiment.
Figure 18:
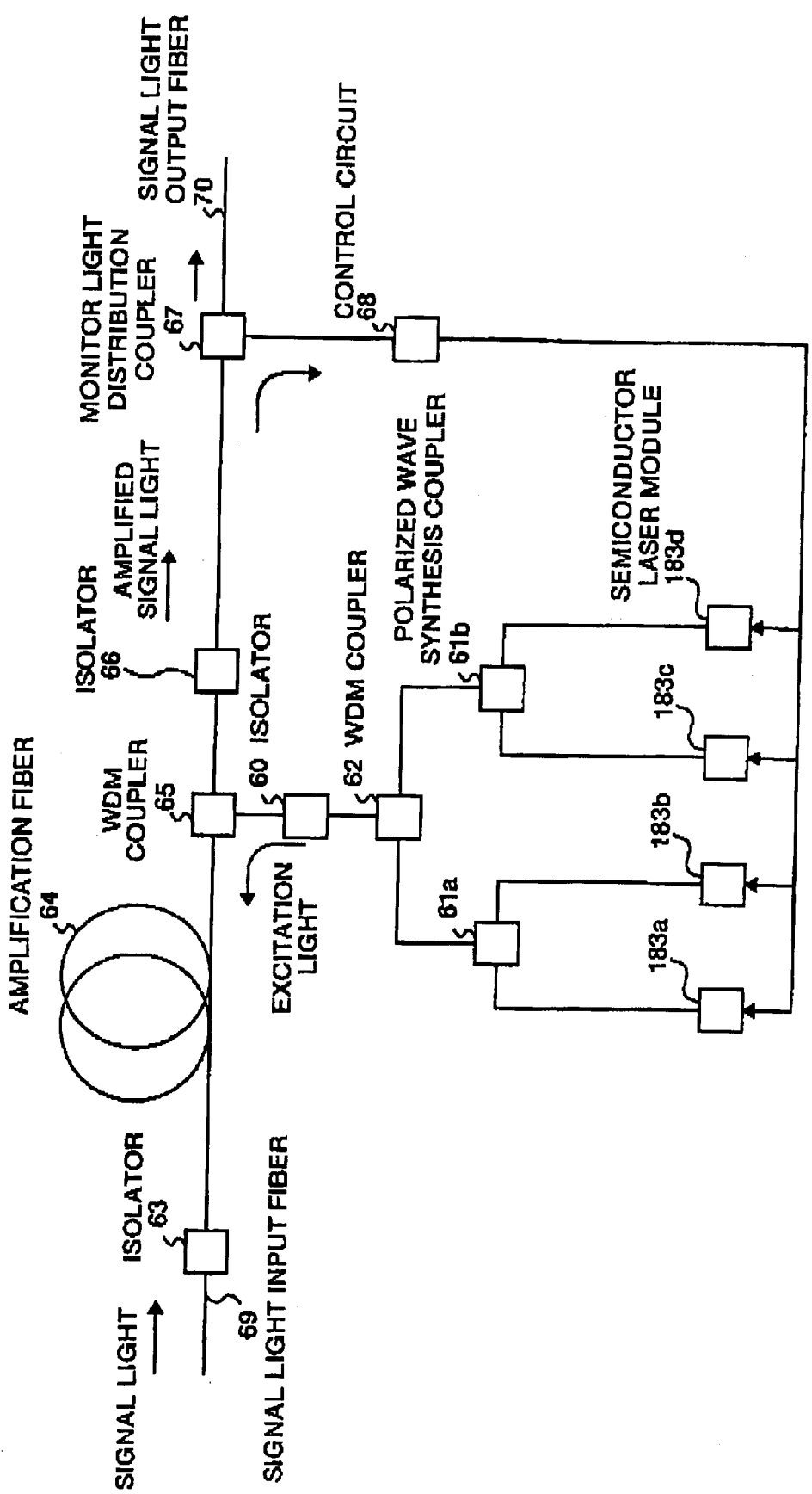
FIG. 18 is a block diagram which shows the configuration of a conventional Raman amplifier employed in a DWDM transmission system.

FIG. 16 is a block diagram which shows the configuration of a Raman amplifier which employs a forward excitation method. In FIG. 16, components having same or similar structure or function as those shown in FIG. 18 have been denoted by the same reference numerals, and to avoid repetition of explanation, their explanation will be omitted.

In the Raman amplifier shown in FIG. 16, a circuit which includes semiconductor laser modules 100a to 100d each of which corresponds to the semiconductor laser module shown in the first or second embodiment, polarization synthesis couplers 61a' and 61b' and a WDM coupler 62', is connected to a WDM coupler 65' which is provided near an isolator 63. The Raman amplifier performs forward excitation to output excitation light output from the WDM coupler 62' in the same direction as that of signal light, In this case, the semiconductor laser module explained in the first embodiment is employed as each of the semiconductor laser modules 100a to 100d. Therefore, RIN is small and the forward excitation can be effectively performed.

Figure 17:
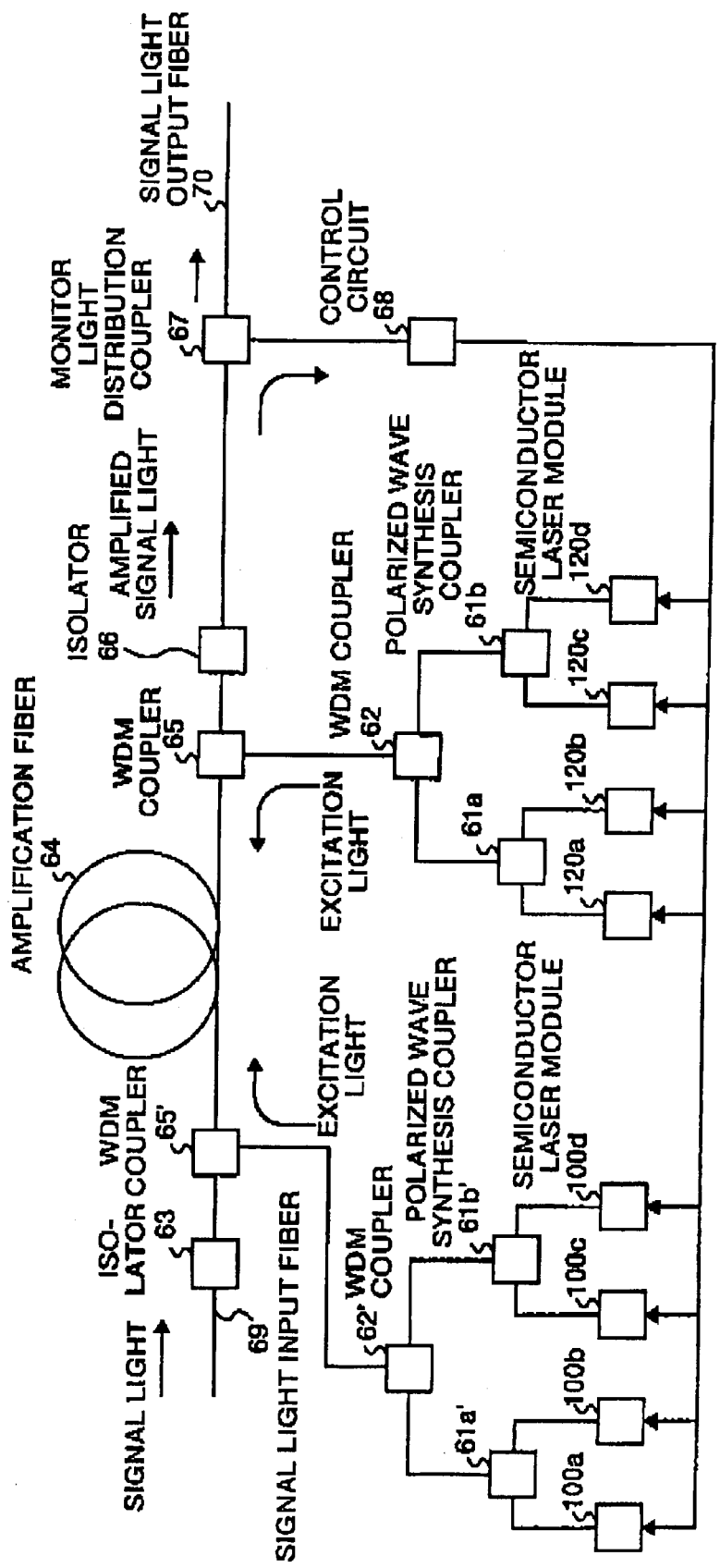
FIG. 17 is a block diagram of the configuration of a Raman amplifier, which employs bidirectional excitation, according to the third embodiment.

FIG. 17 is a block diagram which shows the configuration of a Raman amplifier which employs a bidirectional excitation method. In FIG. 17, components having same or similar structure or function as those shown in FIG. 18 have been denoted by the same reference numerals, and to avoid repetition of explanation, their explanation will be omitted. The Raman amplifier shown in FIG. 17 is constituted by further providing a WDM coupler 62, semiconductor laser modules 120a to 120d each of which corresponds to the semiconductor laser module shown in the first or second embodiment or the corresponding semiconductor laser module and polarization synthesis couplers 61a and 61b, in the configuration of the Raman amplifier shown in FIG. 16. The Raman amplifier shown in FIG. 17 performs backward excitation and forward excitation.

Each of the semiconductor laser modules 120a and 120b outputs a laser beam to the polarization synthesis coupler 61a while each of the semiconductor laser modules 120c and 120d outputs a laser beam to the polarization synthesis coupler 61b. The laser beams that the semiconductor laser modules 120a and 120b oscillate are equal in wavelength. In addition, the laser beams that the semiconductor laser modules 120c and 120d are equal in wavelength but different from the semiconductor laser modules 120a and 120b. This is because the Raman amplifier has a polarization dependency and outputs laser beams the polarization dependency of which is eliminated by the polarization synthesis couplers 61a and 61b.

The laser beams output from the respective polarization synthesis couplers 61a and 61b and differing in wavelength are synthesized by the WDM coupler 62. The synthesized laser beam is output to the amplification fiber 64 as excitation light for Raman amplification through the WDM coupler 65. Amplification target signal light is input into the amplification fiber 64 into which this excitation light is input, and Raman-amplified.

In this bidirectional excitation method, similarly to the forward excitation method, RIM is small and it is possible to effectively perform the forward excitation since the semiconductor laser explained in the first or second embodiment is employed as each of the semiconductor laser modules 100a to 100d.

As explained so far, according to the Raman amplifier in the third embodiment, it is possible to effectively realize Raman amplification including forward excitation with RIN being small by constituting the excitation light source using the semiconductor module shown in the first or second embodiment.

In the third embodiment, a case such that the semiconductor laser module shown in the first or second embodiment is employed as the excitation light source for Raman amplification. However, the present invention is not limited to this embodiment. Quite obviously, the semiconductor laser module shown in the first or second embodiment can be employed as, for example, an EDFA excitation light source of 0.98 µm or the like.

As explained so far, according to the semiconductor laser module according to the present invention, the optical fiber which has the incident end askew polished is employed. It is, therefore, advantageously possible to prevent the reflected light which is generated on the incident end surface from entering the semiconductor laser device as return light. Consequently, it is advantageously possible to reduce RIN and to provide a highly reliable, stable laser beam.

According to the semiconductor laser module according to the present invention, the semiconductor laser module includes the semiconductor laser device which outputs a laser beam in a plurality of oscillation longitudinal modes within the threshold at which induced Brillouin scattering occurs. Therefore, it is advantageously possible to eliminate the fiber grating which causes an increase in RIN characteristic. In addition, since the optical fiber which has the incident end askew polished is employed, it is advantageously possible to prevent the reflected light which is generated on the incident end surface from entering the semiconductor laser device as return light. Consequently, it is advantageously possible to reduce RIN and to provide a highly reliable, stable laser beam.

According to the semiconductor laser module according to the present invention, the non-reflection coatings are formed on the light incident surfaces of the optical components including the optical fiber which constitute the module, respectively. It is, therefore, advantageously possible to further decrease the occurrence of the return light and to further ensure reducing RIN.

According to the Raman amplifier according to the present invention, the amplifier can advantageously exhibit the functions and effects of the semiconductor laser modules explained above and perform stable, highly reliable Raman amplification.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser module comprising:
    a Fabry-Perot type semiconductor laser device;
    an askew incident surface optical fiber, wherein a laser beam emitted from the semiconductor laser device is incident; and
    an isolator positioned between the semiconductor laser device and the incident end of the optical fiber, wherein:
    the semiconductor laser module is used as the source of a forward excitation light of a Raman amplifier and the semiconductor laser module does not have a fiber grating,
    the laser beam includes not less than 2 oscillation longitudinal modes within a half width of an oscillation wavelength spectrum, and
    the isolator has a structure of at least 1.5 stages with a deflector/a Faraday rotator/a deflector being set as one stage, and the isolator is arranged to be inclined relative to the optical axis by about 40°.

2. The semiconductor laser module according to claim 1, wherein the optical fiber comprises a central axis which is fixed while having a predetermined angle with respect to an optical axis of the incident laser beam on the incident surface.

3. The semiconductor laser module according to claim 1, wherein a non-reflection coating is formed on the incident surface of the optical fiber.

4. The semiconductor laser module according to claim 1, wherein at least two optical lenses are provided between the semiconductor laser device and an incident end of the optical fiber, so as to couple the laser beam emitted from the semiconductor laser device with the optical fiber.

5. The semiconductor laser module according to claim 4, wherein at least one of the optical lenses has a non-reflection coating formed on a surface.

6. A semiconductor laser module comprising:
   a semiconductor laser device comprising:
      an active layer;
      a first reflection coating formed on an emission end surface;
      a second reflection coating formed on a reflection end surface; and
      a diffraction grating provided near the active layer, said diffraction grating being formed between the first reflection coating and the second reflection coating,
   wherein the semiconductor laser device emits the laser beam including not less than two oscillation longitudinal modes within a half width of an oscillation wavelength spectrum by setting a combination of oscillation parameters which include a resonator length formed by the active layer and a wavelength selection characteristic of the diffraction grating; and
   an optical fiber comprising an incident surface on which the laser beam is incident, the incident surface being askew polished.

7. The semiconductor laser module according to claim 6, wherein the semiconductor laser device emits the laser beam which is emitted during laser oscillation and which has a wavelength of not less than 1200 nm and not more than 1600 nm.

8. The semiconductor laser module according to claim 6, wherein the semiconductor laser device has a length of not less than 800 $\mu$m and not more than 3200 $\mu$m in a light emission direction.

9. The semiconductor laser module according to claim 6, wherein the diffraction grating has a diffraction grating length of not more than 300 $\mu$m.

10. The semiconductor laser module according to claim 6, wherein the diffraction grating has a diffraction grating length of not more than (300/1300) times as large as the resonator length.

11. The semiconductor laser module according to claim 6, wherein a multiplication value obtained by multiplying a coupling coefficient of the diffraction grating by the diffraction grating length is not more than 0.3.

12. The semiconductor laser module according to claim 6, wherein the diffraction grating has a predetermined periodic fluctuation in a grating period.

13. The semiconductor laser module according to claim 12, wherein the diffraction grating has the grating period changing at random or in a predetermined period.

14. The semiconductor laser module according to claim 6, wherein the first reflection coating of the semiconductor laser device has a reflectivity of not less than 1%.

15. The semiconductor laser module according to claim 6, wherein the optical fiber has a central axis which is fixed while having a predetermined angle with respect to an optical axis of the laser beam incident on the incident surface.

16. The semiconductor laser module according to claim 6, wherein a non-reflection coating is formed on the incident surface of the optical fiber.

17. The semiconductor laser module according to claim 6, wherein an isolator is provided between the semiconductor laser device and an incident end of the optical fiber.

18. The semiconductor laser module according to claim 17, wherein the isolator has a structure of at least 1.5 stages with a deflector/a Faraday rotator/a deflector being set as one stage, and the isolator is arranged to be inclined relative to the optical axis by about 4°.

19. The semiconductor laser module according to claim 6, wherein at least two optical lenses are provided between the semiconductor laser device and an incident end of the optical fiber, so as to couple the laser beam emitted from the semiconductor laser device with the optical fiber.

20. The semiconductor laser module according to claim 19, wherein at least one of the optical lenses has a non-reflection coating formed on a surface.

21. A Raman amplifier comprising a semiconductor laser module comprising:
   a semiconductor laser device comprising:
      an active layer;
      a first reflection coating formed on an emission end surface;
      a second reflection coating formed on a reflection end surface; and
      a diffraction grating provided near the active layer, said diffraction grating being formed between the first reflection coating and the second reflection coating,
   wherein the semiconductor laser device emits the laser beam including not less than two oscillation longitudinal modes within a half width of an oscillation wavelength spectrum by setting a combination of oscillation parameters which include a resonator length formed by the active layer and a wavelength selection characteristic of the diffraction grating; and
   an optical fiber comprising an incident surface on which the laser beam is incident, the incident surface being askew polished.

* * * * *

UNITED STATES PATENT AND TRADEMARK OFFICE
CERTIFICATE OF CORRECTION

PATENT NO. : 6,934,311 B2
DATED : August 23, 2005
INVENTOR(S) : Shimizu et al.

It is certified that error appears in the above-identified patent and that said Letters Patent is hereby corrected as shown below:

<u>Title page,</u>
Item [73], Assignee, should read:
-- **The Furukawa Electric Co.,
LTD.**, Tokyo (JP) --.

Signed and Sealed this

Eighteenth Day of October, 2005

JON W. DUDAS
*Director of the United States Patent and Trademark Office*